US008191783B2

(12) United States Patent
Cheon

(10) Patent No.: US 8,191,783 B2
(45) Date of Patent: Jun. 5, 2012

(54) BAR CODE GENERATION METHOD USING COLOR CODE, DATA COMPRESSION METHOD, AND INTERNET SERVICE METHOD THEREOF

(76) Inventor: Ji-Deak Cheon, Seoul (KR)

( * ) Notice: Subject to any disclaimer, the term of this patent is extended or adjusted under 35 U.S.C. 154(b) by 1187 days.

(21) Appl. No.: 11/814,251

(22) PCT Filed: Jan. 18, 2006

(86) PCT No.: PCT/KR2006/000190
§ 371 (c)(1),
(2), (4) Date: Jul. 18, 2007

(87) PCT Pub. No.: WO2006/093376
PCT Pub. Date: Sep. 8, 2006

(65) Prior Publication Data
US 2008/0191035 A1    Aug. 14, 2008

(51) Int. Cl.
*G06K 7/00* (2006.01)
(52) U.S. Cl. .................... 235/462.04; 235/494
(58) Field of Classification Search .......... None
See application file for complete search history.

(56) References Cited

U.S. PATENT DOCUMENTS 6,283,647 B1 *  9/2001  Konishi et al. ............. 400/103
7,051,935 B2 *  5/2006  Sali et al. ................. 235/462.04
7,185,816 B1 *  3/2007  Shoobridge ............... 235/462.04
7,533,817 B2 *  5/2009  Ming et al. ............... 235/462.04
7,710,598 B2 *  5/2010  Harrison, Jr. ................ 358/1.9
2002/0066786 A1 *  6/2002  Saito ......................... 235/454

FOREIGN PATENT DOCUMENTS

| JP | 2001-043308 | 2/2001 |
| KR | 1020000058832 | 5/2000 |
| KR | 1020010087787 | 9/2001 |
| WO | WO 01-91007 | 11/2001 |

* cited by examiner

*Primary Examiner* — Steven S Paik
*Assistant Examiner* — Sonji Johnson
(74) *Attorney, Agent, or Firm* — Justin H. Kim; Maxon IP LLC

(57) ABSTRACT

A method and a system for exchanging electronic information data, using a color code recognition device are provided. An electronic information data from the first computer is recognized in either in the ASCII code or in the binary digit format. The electronic information data is encoded by substituting each character of the ASCII codes or the binary digit recognized with a color value. The encoded data is transmitted to the second computer, and the transmitted data is decoded into the original electronic information data. The system for exchanging an electronic information data includes a storage device for storing the user identification database and the legend database, an encoding device for encoding the electronic information data, a decoding device for decoding the encoded data to restore the encoded data into its original format, and a network device for transmitting the data between a plurality of computers over the network.

1 Claim, 25 Drawing Sheets

① Bluish purple    ② Bluish green    ③ Yellow-brass    ④ Red

⑤ Gamma ray    ⑥ X-ray    ⑦ Ultraviolet rays    ⑧ Infrared rays    ⑨ Electric wave ① Long wavelength area ② Mid-wavelength area ③ Short wavelength area ⑤ Yellow-green    ⑥ Yellow    ⑦ Yellow-red ① Bluish purple    ② Blue    ③ Bluish green    ④ Green ① Energy quantity   ② Three primary colors of light   ③ Three primary colors of color ① Filter  ②Detector(RGB filter)  ③Micro Computer  ④ Output (Display)

FIG.14

Figure of Calibration Factor Value of Spectral Diffraction Response for each Wavelength

| Wavelength (nm) | value | Wavelength (nm) | value | Wavelength (nm) | value |
|---|---|---|---|---|---|
| 380 | 2.7289 | 411 | 0.9238 | 442 | 0.7352 |
| 381 | 2.5562 | 412 | 0.8997 | 443 | 0.7349 |
| 382 | 2.3731 | 413 | 0.8912 | 444 | 0.7414 |
| 383 | 2.2206 | 414 | 0.8645 | 445 | 0.7413 |
| 384 | 2.1229 | 415 | 0.8597 | 446 | 0.7428 |
| 385 | 2.0867 | 416 | 0.8408 | 447 | 0.7460 |
| 386 | 1.9807 | 417 | 0.8093 | 448 | 0.7543 |
| 387 | 1.9648 | 418 | 0.7932 | 449 | 0.7648 |
| 388 | 1.8283 | 419 | 0.7844 | 450 | 0.7636 |
| 389 | 1.7968 | 420 | 0.7932 | 451 | 0.7730 |
| 390 | 1.7009 | 421 | 0.7844 | 452 | 0.7711 |
| 391 | 1.6531 | 422 | 0.7690 | 453 | 0.7772 |
| 392 | 1.6050 | 423 | 0.7643 | 454 | 0.7850 |
| 393 | 1.5445 | 424 | 0.7524 | 455 | 0.7869 |
| 394 | 1.4954 | 425 | 0.7481 | 456 | 0.7953 |
| 395 | 1.4672 | 426 | 0.7336 | 457 | 0.8034 |
| 396 | 1.4537 | 427 | 0.7329 | 458 | 0.8019 |
| 397 | 1.3732 | 428 | 0.7193 | 459 | 0.8112 |
| 398 | 1.3345 | 429 | 0.7105 | 460 | 0.8132 |
| 399 | 1.2644 | 430 | 0.7097 | 461 | 0.8155 |
| 400 | 1.2624 | 431 | 0.7090 | 462 | 0.8161 |
| 401 | 1.2201 | 432 | 0.7123 | 463 | 0.8148 |
| 402 | 1.1715 | 433 | 0.7121 | 464 | 0.8200 |
| 403 | 1.1299 | 434 | 0.7096 | 465 | 0.8229 |
| 404 | 1.1113 | 435 | 0.7089 | 466 | 0.8233 |
| 405 | 1.0832 | 436 | 0.7130 | 467 | 0.8235 |
| 406 | 1.0244 | 437 | 0.7189 | 468 | 0.8254 |
| 407 | 1.0204 | 438 | 0.7205 | 469 | 0.8282 |
| 408 | 0.9952 | 439 | 0.7316 | 470 | 0.8260 |
| 409 | 0.9792 | 440 | 0.7277 | 471 | 0.8304 |
| 410 | 0.9307 | 441 | 0.7347 | 472 | 0.8409 |

FIG.15

Coordinate value of color of RGB light body

|   | R (Red) | G (Green) | B (Blue) |
|---|---|---|---|
| x | 0.6090 | 0.3182 | 0.1455 |
| y | 0.3888 | 0.6125 | 0.0473 |

① Optical scanning device(standard light is emitting) or Detector(RGB filter) or (Scanner)
② Digital signalized circuit and RGB algorithm data
③ RGB photodiode detecting data
④ RGB Code in jack ① Optical scanning device(standard light is emitting)
② Detector(RGB filter)
③ Circuit for amplification and signal process (RGB photodiode detecting data)
④ Digital signalized circuit and RGB algorithm data
⑤ Lamp buzzer
⑥ EDGE detecting circuit
⑦ Data indication device
⑧ External equipment controlling device
⑨ Secondary memory unit
⑩ (Scanner)
⑪ (Decoder)

FIG.18

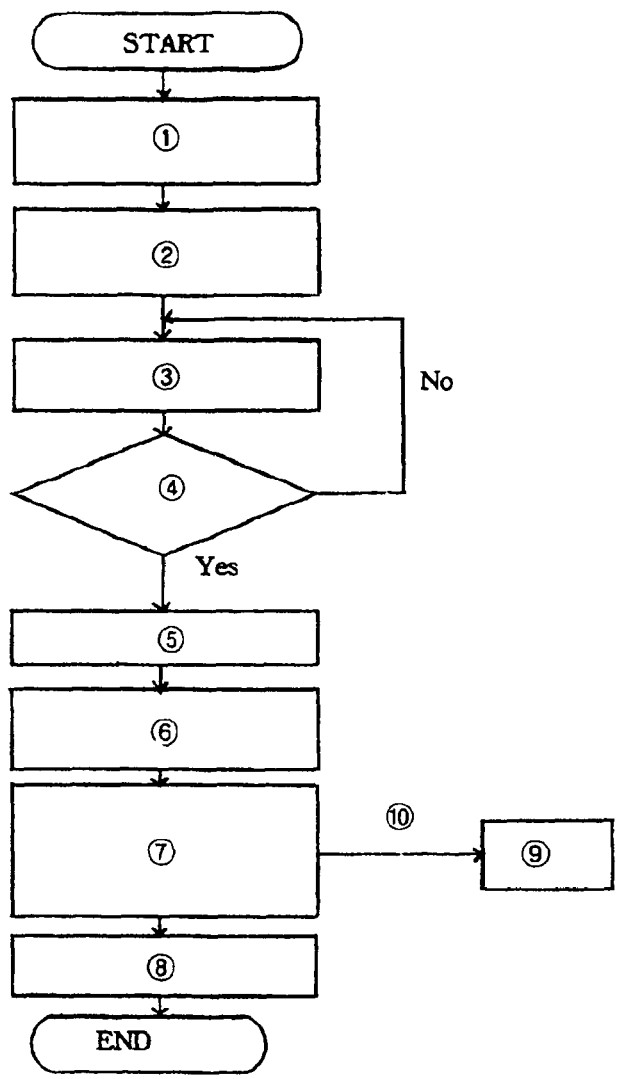

① Scannerdigital signal input

② To converting digital signal to time units buffer the value save

③ That is unfilled space hollow of a grain mortar of beginning and end

④ Bar Code data confirmation

⑤ Thressold's calculation

⑥ Beginning character/end character confirmation scan direction decision

⑦ Analysis by each Symbology appointed algorithm

⑧ Data output

⑨ Analysis discontinuance

⑩ At verification bug

① Motor drive unit
② Laser drive unit
③ RGB barcode
④ Scanning device
⑤ Standard light source generating device
⑥ Optic-electricity converter
⑦ A/D converter
⑧ R.G.B data detecting
⑨ Speaker
⑩ Analysis of algorithm for RGB detecting
⑪ Memory
⑫ Interface unit
⑬ Control circuit
⑭ Optical system

FIG.20

① order    ② wavelength    ③ corresponding variable value

| ① | ② (nm) | L(n)*a(n)*b(n)* | ③ | ① | ② (nm) | L(n)*a(n)*b(n)* | ③ |
|---|---|---|---|---|---|---|---|
| 1 | 380 | L1*a1*b1* | 0 | 35 | 414 | L35*a35*b35* | Y |
| 2 | 381 | L2*a2*b2* | 1 | 36 | 415 | L36*a36*b36* | Z |
| 3 | 382 | L3*a3*b3* | 2 | 37 | 416 | L37*a37*b37* | - |
| 4 | 383 | L4*a4*b4* | 3 | 38 | 417 | L38*a38*b38* | . |
| 5 | 384 | L5*a5*b5* | 4 | 39 | 418 | L39*a39*b39* | Space |
| 6 | 385 | L6*a6*b6* | 5 | 40 | 419 | L40*a40*b40* | $ |
| 7 | 386 | L7*a7*b7* | 6 | 41 | 420 | L41*a41*b41* | / |
| 8 | 387 | L8*a8*b8* | 7 | 42 | 421 | L42*a42*b42* | + |
| 9 | 388 | L9*a9*b9* | 8 | 43 | 422 | L43*a43*b43* | % |
| 10 | 389 | L10*a10*b10* | 9 | 44 | 423 | L44*a44*b44* | Σ |
| 11 | 390 | L11*a11*b11* | A | 45 | 424 | L45*a45*b45* | ℃ |
| 12 | 391 | L12*a12*b12* | B | 46 | 425 | L46*a46*b46* | ¥ |
| 13 | 392 | L13*a13*b13* | C | 47 | 426 | L47*a47*b47* | £ |
| 14 | 393 | L14*a14*b14* | D | 48 | 427 | L48*a48*b48* | °F |
| 15 | 394 | L15*a15*b15* | E | 49 | 428 | L49*a49*b49* | ★ |
| 16 | 395 | L16*a16*b16* | F | 50 | 429 | L50*a50*b50* | ☎ |
| 17 | 396 | L17*a17*b17* | G | 51 | 430 | L51*a51*b51* | ♪ |
| 18 | 397 | L18*a18*b18* | H | 52 | 431 | L52*a52*b52* | & |
| 19 | 398 | L19*a19*b19* | I | 53 | 432 | L53*a53*b53* | @ |
| 20 | 399 | L20*a20*b20* | J | 54 | 433 | L54*a54*b54* | ₩ |
| 21 | 400 | L21*a21*b21* | K | 55 | 434 | L55*a55*b55* | ♣ |
| 22 | 401 | L22*a22*b22* | L | 56 | 435 | L56*a56*b56* | Good |
| 23 | 402 | L23*a23*b23* | M | 57 | 436 | L57*a57*b57* | Morning |
| 24 | 403 | L24*a24*b24* | N | 58 | 437 | L58*a58*b58* | How |
| 25 | 404 | L25*a25*b25* | O | 59 | 438 | L59*a59*b59* | are |
| 26 | 405 | L26*a26*b26* | P | 60 | 439 | L60*a60*b60* | you |
| 27 | 406 | L27*a27*b27* | Q | 61 | 440 | L61*a61*b61* | AND |
| 28 | 407 | L28*a28*b28* | R | . | . | . | . |
| 29 | 408 | L29*a29*b29* | S | . | . | . | . |
| 30 | 409 | L30*a30*b30* | T | . | . | . | . |
| 31 | 410 | L31*a31*b31* | U | . | . | . | . |
| 32 | 411 | L32*a32*b32* | V | n-2 | 768 | L(n-2)*a(n-2)*b(n-2)* | |
| 33 | 412 | L33*a33*b33* | W | n-1 | 769 | L(n-1)*a(n-1)*b(n-1)* | |
| 34 | 413 | L34*a34*b34* | X | n | 780 | L(n)*a(n)*b(n)* | |

① order      ② corresponding variable value

| ① | ② | Bar | Space | ① | ② | Bar | Space |
|---|---|-----|-------|---|---|-----|-------|
| 1 | 1 | 10001 | 0100 | 23 | M | 11000 | 0001 |
| 2 | 2 | 01001 | 0100 | 24 | N | 00101 | 0001 |
| 3 | 3 | 11000 | 0100 | 25 | O | 10100 | 0001 |
| 4 | 4 | 00101 | 0100 | 26 | P | 01100 | 0001 |
| 5 | 5 | 10100 | 0100 | 27 | Q | 00011 | 0001 |
| 6 | 6 | 01100 | 0100 | 28 | R | 10010 | 0001 |
| 7 | 7 | 00011 | 0100 | 29 | S | 01010 | 0001 |
| 8 | 8 | 10010 | 0100 | 30 | T | 00110 | 0001 |
| 9 | 9 | 01010 | 0100 | 31 | U | 10001 | 1000 |
| 10 | 0 | 00110 | 0100 | 32 | V | 01001 | 1000 |
| 11 | A | 10001 | 0010 | 33 | W | 11000 | 1000 |
| 12 | B | 01001 | 0010 | 34 | X | 00101 | 1000 |
| 13 | C | 11000 | 0010 | 35 | Y | 10100 | 1000 |
| 14 | D | 00101 | 0010 | 36 | Z | 01100 | 1000 |
| 15 | E | 10100 | 0010 | 37 | - | 00011 | 1000 |
| 16 | F | 01100 | 0010 | 38 | . | 10010 | 1000 |
| 17 | G | 00011 | 0010 | 39 | Space | 01010 | 1000 |
| 18 | H | 10010 | 0010 | 40 | ★ | 00110 | 1000 |
| 19 | I | 01010 | 0010 | 41 | $ | 00000 | 1110 |
| 20 | J | 00110 | 0010 | 42 | / | 00000 | 1101 |
| 21 | K | 10001 | 0001 | 43 | + | 00000 | 1011 |
| 22 | L | 01001 | 0001 | 44 | % | 00000 | 0111 |

TRANSMITTED WAVELENGTHS

ABSORBING FITTER MATERIAL (Attenuation by coloidal scatter))

NON-TRANSMITTED WAVELENGTHS ABSORBING INFITTER IN MATERIAL

① Arrangement of general photo diode

② amplifier  ③ Digitizing circuit(R.G.B. algorithm)  ④ Output
⑤ Lens

FIG.26

Relation between optical wavelength of color theory and color name, and (Symbol of RGB bar's example application)

(R.G.B Bar)

| Wavelength (nm) | | Symbolic | R.G.B Bar |
|---|---|---|---|
| 380~430 | bluish Purple | bP | C 1 |
| 430~467 | purple Blue | pB | C 2 |
| 467~483 | Blue | B | C 3 |
| 483~488 | greenish Blue | gB | C 4 |
| 488~493 | Blue Green | BG | C 5 |
| 493~498 | bluish Green | bG | C 6 |
| 498~530 | Green | G | C 7 |
| 530~558 | yellowish Green | yG | C 8 |
| 558~569 | Yellow Green | YG | C 9 |
| 569~573 | greenish Yellow | gY | C10 |
| 573~578 | Yellow | Y | C11 |
| 578~586 | yellowish Orange | yO | C12 |
| 586~597 | Orange | O | C13 |
| 597~640 | reddish Orange | rO | C14 |
| 640~780 | Red | R | C15 |

FIG. 30

① order  ② color code value  ③ corresponding variable

| ① | ② | ③ | ① | ② | ③ |
|---|---|---|---|---|---|
| 1 | #000000 | 0 | 25 | #FFFFFF | O |
| 2 | #010101 | 1 | 26 | #BABABA | P |
| 3 | #111111 | 2 | 27 | #BBBBBB | Q |
| 4 | #020202 | 3 | 28 | #BCBCBC | R |
| 5 | #212121 | 4 | 29 | #BDBDBD | S |
| 6 | #232323 | 5 | 30 | #BEBEBE | T |
| 7 | #343434 | 6 | 31 | #BFBFBF | U |
| 8 | #454545 | 7 | 32 | #CACACA | V |
| 9 | #565656 | 8 | 33 | #CBCBCB | W |
| 10 | #676767 | 9 | 34 | #CCCCCC | X |
| 11 | #787878 | A | 35 | #CDCDCD | Y |
| 12 | #909090 | B | 36 | #CECECE | Z |
| 13 | #A0A0A0 | C | 37 | #CFCFCF | + |
| 14 | #A1A1A1 | D | 38 | #D0D0D0 | $ |
| 15 | #B1B1B1 | E | 39 | #DBDBDB | & |
| 16 | #C1C1C1 | F | 40 | #DCDCDC | @ |
| 17 | #D1D1D1 | G | 41 | #DDDDDD | Good |
| 18 | #E1E1E1 | H | 42 | #DEDEDE | KOBEA |
| 19 | #F1F1F1 | I | 43 | #DFDFDF | How are you |
| 20 | #AAAAAA | J | . | . | . |
| 21 | #BABAB | K | . | . | . |
| 22 | #ACACAC | L | N-2 | #N-2 | Necessity is mother of invention |
| 23 | #ADADAD | M | N-1 | #N-1 | Color code |
| 24 | #AEAEAE | N | N | #N | Meth and the Tool of Networking Service on Internet Using Algorithm of Coding Decoding Values of Color code |

FIG.31

| Service code | Ramdom code | ID | Password |
|---|---|---|---|
| #FF0AEF | #67AA8F | CHEON | 1234 |

→ Service DB

FIG.32

| Individual Server Add | Service Server Add |
|---|---|
| Colorbarcode.com | Yahoo.com |

→ Servier add DB

FIG.33

| Individual Name | ADD | E-mail | Tel number |
|---|---|---|---|
| CHEON JI DEAK | SEOUL | CJD@ABC | 1234 |
| . | . | . | . |
| N-1 | N-1 | N-1 | N-1 |
| N | N | N | N |

→ Individual Server DB

FIG.34

| Attestatio Values | ID | Password | User Name | Ramdom code | E-mail | Individual Server Add | Service Server Add |
|---|---|---|---|---|---|---|---|
| #FF0AEF | SEOUL | CJD@ABC | CHEON JI DEAK | #67AA8F | CJD@ABC | Colorbarcode.com | Yahoo.Com |
| . | . | . | . | . | . | . | . |
| N-1 | N-1 | N-1 | N-1 | N-1 | N-1 | N-1 | N-1 |
| N | N | N | N | N | N | N | N |

→ Attestatio Values of Color code DB (1) Start (2) User's application for registration (3) DB User's DB (4) User's service data/main server address data are provided (5) DB Service server DB (6) Service data encoding (7) Encoded service data/Service data color code value encoding (8) Color code value is provided by user (9) End

FIG.36

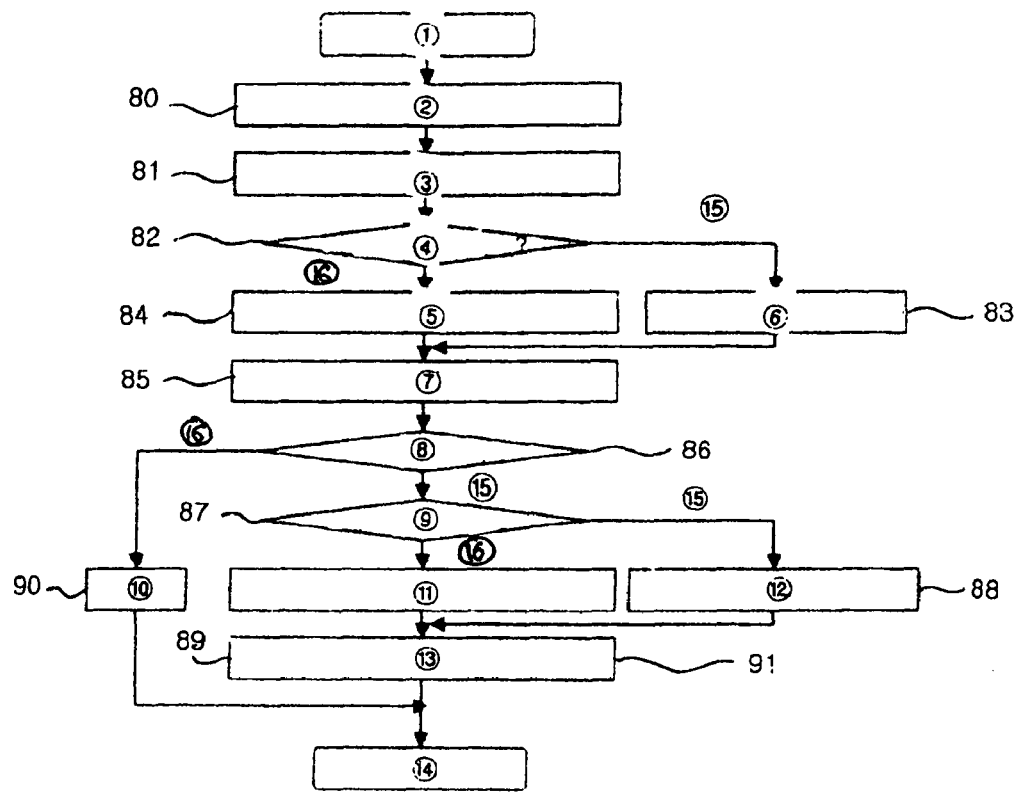

① Start

② Enter the color code value

③ Decode the color code value and display the data

④ Service server address?

⑤ Connect to the service server

⑥ Connect to the designated service server

⑦ Encoding/decoding of the service server data

⑧ Whether to provide a right?

⑨ Service server address?

⑩ Error

⑪ Connect to the basic service server

⑫ Connect to the designated service server

⑬ Provide a service

⑭ End

⑮ Yes

⑯ No

①Register ②software ③coloe code ④color code ⑤color code ⑥inf. supply decision ⑦service ⑧service ①register ②software ③color code ④color code ⑤color code ⑥inf. Supply decision ⑦service

FIG.40

① order  ② Compressed data  ③ Color code value
④ Corresponding variable  ⑤ File form

Color Code Algorithm Data

| ① | Basic Data | Ex) Basic Data Binary Digit | Ex) ② Data 8Bit Channel | Ex) ③ Html Code | Ex) Color Code | Ex) ④ 16Bit Channel Binary Digit | Ex) ⑤ |
|---|---|---|---|---|---|---|---|
| 1 | *.TXT | 00110110... | A6B2E1D3-- | #000000 | ☐ | 01010101 01010101-- | *.COL |
| 2 | *.HWP | 01010011... | A2B2C7G4-- | #010101 | ■ | 10101010 10101010-- | *.COL |
| 3 | *.BMP | 01101111... | F4S2A3H4-- | #111111 | ■ | 11111111 11111111-- | *.COL |
| 4 | *.JPG | 01110010... | F2J1D3N4-- | #020202 | ■ | 10000000 00000000-- | *.COL |
| 5 | *.TIFF | 00110010... | S8C4H2L8-- | #212121 | ■ | 11000000 00000000-- | *.COL |
| 6 | *.GIF | 01010110... | A5V5B2N5-- | #232323 | ■ | 11100000 00000000-- | *.COL |
| 7 | *.ARJ | 00110100... | B3M5V3D5-- | #343434 | ■ | 11110000 00000000-- | *.COL |
| 8 | *.ZIP,... | 10100000... | A6C2B3X2-- | #454545 | ■ | 11111000 00000000-- | *.COL |
| 9 | *.AVI | 10011001... | F2H3C4X4-- | #565656 | ☐ | 11111100 00000000-- | *.COL |
| 10 | *.MPEG | 01011100... | D6S6K3L1-- | #676767 | ■ | 11111110 00000000-- | *.COL |
| 11 | *.RM | 01010111... | A5S5J2N2-- | #787878 | ■ | 11111111 00000000-- | *.COL |
| 12 | *.FLC | 00100100... | A2B3C5A2-- | #909090 | ■ | 01000000 00000000-- | *.COL |
| 13 | *.FLI | 10101010... | S6B2J4K2-- | #A0A0A0 | ■ | 01000000 00000000-- | *.COL |
| 14 | *.MOV | 10000000... | E3S6B2A6-- | #A1A1A1 | ☐ | 01100000 00000000-- | *.COL |
| 15 | *.ASF | 11000000... | H2A3C4S1-- | #B1B1B1 | ■ | 01110000 00000000-- | *.COL |
| 16 | *.WMV,... | 11100000... | E6W3D5C2-- | #C1C1C1 | ☐ | 01111000 00000000-- | *.COL |
| 17 | *.MID | 11110000... | S1J2K3S6-- | #D1D1D1 | ■ | 01111100 00000000-- | *.COL |
| 18 | *.WAV | 11111000... | B3D4F2G8-- | #E1E1E1 | ■ | 01111110 00000000-- | *.COL |
| 19 | *.MP3 | 11111100... | J2F3S6F1-- | #F1F1F1 | ■ | 01111111 00000000-- | *.COL |
| 20 | *.MP4,... | 11111110... | H3D4K2C5-- | #A2A2A2 | ☐ | 01111111 10000000-- | *.COL |
| ... | . | . | . | . | . | . | . |
| N-2 | | | | | | | |
| N-1 | Color code | 01100000... | T3K2L1M5-- | #N-1 | ■ | 01111111 11110000-- | *.COL |
| N | # DATA | N Binary Digit | N 8Bit Channel | #N | ■ | N Binary Digit | *.COL |

BAR CODE GENERATION METHOD USING COLOR CODE, DATA COMPRESSION METHOD, AND INTERNET SERVICE METHOD THEREOF

TECHNICAL FIELD TO WHICH THE INVENTION BELONGS TO

This invention is about a barcode generation algorithm using color codes, and a data compression method and an internet service method thereof.

THE CONVENTIONAL TECHNOLOGY OF THE FIELD

Due to ever developing industries today, the needs of technology for processing unlimited information that is getting more massive have led conventional barcodes to today's development. That is, a barcode symbology, which performs a role of an electronic language, has developed variously according to the necessity, and it is used variously by being designated as the standard of the business circulation information process of each industry sector. For example, as for the application field, various representing methods and characteristics of an algorithm have developed to be designated as the standard for each industry sector for use; code 39 is used for the industries of the automobile, national defense, medical service, flight, air-conditioning, papers, and aluminum. UPC/EAN is used for the POS field. Code 128 is used for clothes. The code bar is used for the blood field, and 2 of 5 code is used for the air ticket field, and code 93 and code 11 also are used for specific industry sectors.

The reason why various symbology is developed this way is due to the limitation of the realization method of an algorithm that is restricted to a limited logic of binary numbers, and also, in reality, the conventional barcode symbology system cannot be compatible with each other.

The barcode is made based on the following simple principle method; Detects an interval between a black line composed of black and white colors simply and a space. Then, the analogue signal of a light source that was reflected from the luminous body of a scanner is processed to be amplified, and the data that have been converted into the digital signals are respectively transmitted to a developed decoding algorithm and are decoded to be displayed and detected so as to meet the standard of industry sectors.

However, there is an inevitable problem of the limited representation method that a unified barcode cannot be made so that massive data in each industry sector can be processed with this simple binary number conversion logic. Therefore, in reality, the algorithm has been interpreted as the difference of arithmetic arrangement methods from the early period of the barcode development to today.

This invention is described below in detail; 281,474,976, 710 colors, for which the colors of 16 bit channel are realized with color code values of HTML color recognition that can be recognized electronically, are applied to corresponding variables in the form of factor values of red, green, and blue, which are three primary lights, that is, in the form of the color code value that is recognized electronically (for example, HTML code, RGB code, C++ code . . . ). By this method, color code values are respectively provided, so this invention is regarding the barcode generation algorithm using the color code and the data compression and internet service method thereof that provides a person, who was endowed with an authority of using information, with the internet service network whose corresponding color code value is indicated, and checks whether the internet network service is provided by using the network service according to the provided color code value and the algorithm information, which was programmed for the provided color code value.

According to development of a network, the system for providing a service through the internet service is applied to each field such as personal management, financial management settlements of account, and electronic commerce, and the electronic information process for realization of the ubiquitous is applied to each industrial sector. The internet network service system should protect the personal and organization's data and an option should be provided that only the person with a just authority can access the internet network service.

Generally, the person who receives the internet network service, provides (in ID(identifier) and a password. These ID and password are encoded by applying the algorithm that convert these characters into other codes and they are saved. The person who receives a service, enters the ID and password, and encodes them by applying the same algorithm and determines whether the encoded ID and password are identical to the code that has been already saved, in order to receive the internet network service. Also, when documents or data are transmitted and received in the internet network service environment, these documents or data are encoded or the method of digital signature is applied.

In the conventional internet service system like this, the person who will receive an internet network service is dependent on the memory of the person who receives the internet network service. Accordingly, when many data are shared, there occur many problems in the personal data management. Moreover, the problem that requires the management of complicated data should be resolved at this current time. That is, the problems, such as the loss of an ID or password, and the disclosure of important data due to the appropriation of an ID or password, are the tasks that should be resolved at the present.

As a measure for complementing the above stated problems, the technology for providing the internet network service by using biometric information including a fingerprint, iris, or the blood vessel of hands is developed to be supplied. Also, in the logistics and data processing field, the conventional area of black and white barcodes is going to be replaced by RFID, but it is not easy to be replaced in all areas such as the standard area, system, reader, sensor (tag) since there is more restrictions in a RF interference, interval of tags, and power supply than in the barcode system and color code system. Since these technologies tend to require high economic costs for common uses, it has a problem in realizing a real ubiquitous. In addition, in the information processing and data management area, the international standardization business that simplifies and manages more information in the competitions of numerous software development companies is researched and developed over the world. In case of the information process that can be recognized electronically, source data, which are recorded as the ASCII file and binary digit file, are managed by being saved as a compressed file. Such files are as follows; As for the motion picture file, there are FLI, FLC, AVI, MPEG, ASF, WMV, RM, and VOM. As for the music file, there are mid, wav, mp3, and mp4. As for the image file, there are BMP, JPC, TIF, GIF, and ARJ. Also, as for the text file, the TXT, RFT, DOC, and HWP are used.

TECHNOLOGICAL TASK INTENDED BY INVENTION

The purpose of this invention is as follows; Its purpose is to maintain the one-dimensional representation method of an existing barcode, but applies an optical light source, which exists in the solar system, to use an electronic wavelength value of a limitless light source as a basic value of data and apply it to the barcode. That is, another purpose of this invention is to provide the barcode generation algorithm and the data compression method and internet service method thereof, which are described below in detail; The system can be configured by complementing the technology equipment of the electronic optical machine, which can be actually available by the development of an electronic machine. Also, the system of a barcode that is getting massive limitlessly can be integrated by the application value of an algorithm, and the R.G.B. barcode system of an optical representation method, which can be made the barcode so that the existing document that became electronically recorded can be easily kept, should be provided. In addition, in the information processing and data file management areas, in case of the ASCII file and binary digit file of existing data files, the information into which the existing file, which was made by additionally compressing the existing file, into which the repetitive numbers of cases were compressed, was saved and compressed, should be converted into the color code value (Html, C++) and saved by being made to correspond to the parameter factor value of the encoding and decoding algorithm of a color code value. And, the above color code, which was made and saved by being converted from the information, can be kept as the image value of the pixel unit of a graphic image color value. Also, the source file and the existing compressed file should not be transmitted in the wired and wireless internet network by being saved as the color code value (Html, C++) but the color code information data should be transmitted so that the information can be managed at decreased data transmitting speed and in transmitting information quantities.

The methods of the internet network service by this intention for achieving the above stated purposes are as follows; In the method of providing the required information service after the identification checking process that checks whether an information user has received rightful information in the internet network service, (a) The step where the color code value of the factor value of three primary lights(RGB), which is physically or electronically recognized, is entered in the information provision media of a person who wants to receive information;

(b) The step where the information provision media of a person who wants to receive information is extracted by using encoding and decoding algorithms for the color code value that has been indicated in the information provision media of a person who wants to receive the above information.

(c) The step where the above provided information on the media is transmitted to the above internet network service server.

(d) The step where the server, which receives the color code value of a user, determines whether the user is a person who can really receive the provided media code (e) If a person is determined as a person who wants to receive rightful information in the above determination step, the step that provides the internet network service information to a person who wants to receive information is also included.

Additionally, by adding the existing method for the person who wants to receive information in the above determination step, the information can be serviced optionally so that the ID and password are entered.

In addition, in order to achieve the above stated purposes of this invention, the internet network service information provision device according to this invention has the characteristics that include the following devices in the system, where a service provider (server computer) provides a network service to an applicant (client computer) via the internet.

1) Saving device: This device is used to save a selected coding algorithm code, which makes the information, such as characters, numbers, words, sentences, or files, by making it to correspond to each color code, which was made by combination of red, green, and blue color with numerous gray levels, and the information on applicants.

2) Provision device: This device is used to allot information on whether internet network service information is provided to an applicant who wants to receive information so that the information should be converted into color codes according to the above selected coding algorithm, or this device is used to save or provide color codes.

3) Data conversion device: This device is used to make information including letters, numbers, words, sentences, or files to each of color code that was made by combining the colors of red, green, and blue with numerous gray levels correspond in order to convert the information into machine languages.

4) Judgment device: After data on machine languages for conversing the above converted color code are entered, this device is used to decode the data by the above selected coding algorithm and extract data on whether to provide the internet network service information, which is included in the above code value, in order to judge whether the person is the one who wants to receive just information.

The above color code value is composed of forms, color code values, patterns, unit cells, and hierarchal cells of combination, which are formed by numbers of over one, "0-9", alphabet capitals and small letters, "A,a-Z,z", "special characters", "words", "sentences", and "files", which were included in the information on whether the above internet network service information is provided or not, being converted by the color code value conversion algorithm, which respectively maps to each color code value of each number "0-9", alphabet capitals and small letters, "A,a-Z,z", "special characters", "words", "sentences", and "files".

In order to achieve another task of this invention, the media for providing the internet network service information includes the following color code value information provision device; in this device, the information regarding whether to provide the information is encoded by the encoding algorithm of color code values and converted into the color code value, which is represented physically, and the above color code value is indicated in the above media.

EFFECT OF INVENTION

This invention, like the foregoing, with hexadecimal HTML color recognition color code value that electronic recognition is available, as applying 281,474, 976,710 colors creating 16 bit channeled color to corresponding variable as 3 elements factor value of light (RGB (Red, Green,Blue), color code value) is offered, in the one-dimensional barcode field in which data-processed as recognized as the original black and white, the available field by number of combination of color code value of 3 elements factor value Red,Green,Blue of light of more data-processing parameter, is like the following;

1) Alternation of one-dimensional code.
2) Extension of two-dimensional code (physical distribution, circulation, POS, other)

3) EOS (Exhibition Operating System), For pass issue, For visitor check, Visitor DB installation
4) Product by the medium of digital camera, Sports marketing
5) Off line—On line combination event installation by using digital camera and internet.
6) Image database area installation
7) Digital camera or digital image-used wireless communication, portable internet search area.
8) Camera phone-used wireless communication, portable internet search service.
9) Ubiquitous System by the medium of wireless communication instrument with a built-in digital camera or exclusive reader and Personal ID.

In addition, the popularization of color code would be accomplished thanks to barcode system alternation with wireless communication commonly named as RFID and development of various information sources.

The investment (system, reader, RFID chip, VS system, digital camera, color code by digital output) which is smaller than RFID that is one of extension system as well as an alternation of one-dimensional code might achieve big effect of practical use.

Also, for the data saving method of electronic information with color code factor value, there's an effect to compress again already compressed file, for the transmission method of information on internet network, the existed file is not transmitted as it is, it's transmitted as recognizing color parameter value as 16 bit channel, or as saving by image file type made by value arrangement saved by pixel unit, as simply minimizing a great deal of data, it's transmitted as same effect as receiving one image file. User who got transmission, by encoding, decoding algorithm of color code value built in his main computer, by the way of amplifying from each user's computer, the service of data information compression and cancellation of compression is offered. Also, in the field of internet service, the internet service code offered to the person who is offered authority to use, is offering multiply security function more than other technology, it aims at offering internet service method and compression of barcode and data by using encoding, decoding algorithm of color code value, of which feature is to offer secured service to user.

SIMPLE DESCRIPTION OF DRAWING

Drawing 1 represents the color mode of C.M.Y.K.
Drawing 2 represents the color mode of R.G.B.
Drawing 3 shows the classified types of electronic wavelengths of a light source.
Drawing 4 represents the analysis of a white-color light source by a prism and a spectrum.
Drawing 5 represents the wavelength of a visible ray and a color gamut.
Drawing 6 represents the three primary colors of lights and the three primary colors of colors.
Drawing 7 is the optical system of a spectrophotometer and the schematic diagram of an electronic system.
Drawing 8 represents the composition of L*a*b* color system coordinates of CIE system of color specification.
Drawing 9 represents the measurement principle of R.G.B of a physical measurement method.
Drawing 10 represents a R.G.B color coordinate system.
FIG. 1 represents the color mode of C.M.Y.K.
FIG. 2 represents the color mode of R.G.B.
FIG. 3 shows the classified types of electronic wavelengths of a light source.
FIG. 4 represents the analysis of a white-color light source by a prism and a spectrum.
FIG. 5 represents the wavelength of a visible ray and a color gamut.
FIG. 6 represents the three primary colors of lights and the three primary colors of colors.
FIG. 7 is the optical system of a spectrophotometer and the schematic diagram of an electronic system.
FIG. 8 represents the composition of L*a*b* color system coordinates of CIE system of color specification.
FIG. 9 represents the measurement principle of R.G.B of a physical measurement method.
FIG. 10 represents a R.G.B color coordinate system.
FIG. 11 represents the color solid triangle composition of H.S.I color.
FIG. 12 is a solid diagram based on the round angle, 360 degree, of H.S.I.
FIG. 13 is the prototype model diagram of color values.
FIG. 14 is the table which compared calibration factors of spectrum response for each wavelength.
FIG. 15 is the color coordinate value of a R.C.B light source.
FIG. 16 is the skew drawing of an example that used R.G.B bar code system by using the CIE system of color specification.
FIG. 17 represents the structure of a bar code reader.
FIG. 18 represents a decoder process.
FIG. 19 represents a practical example of the configuration of R.G.B barcode reader.
FIG. 20 is the example table of variables that corresponds to algorithms according to the wavelength of the R.G.B bar code using the CIE system of the color specification.
FIG. 21 represents the pattern to which code 39 symbol letters are applied.
FIG. 22 represents the structure of a R.G.B photo diode filter.
FIG. 23 represents the optical system structure of the scanner of a photo diode.
FIG. 24 represents the general field structure of a barcode.
FIG. 25 represents the field structure of a R.G.B barcode.
FIG. 26 represents relations between an optical wavelength of color theory and a color name.
FIG. 27 represents a practical example of a computer network system configuration for performing a service according to this invention.
FIG. 28 represents the second practical example of a computer network system configuration for performing a service according to this invention.
FIG. 29 represents a practical example of internet network services that are provided to users, who want to receive service information, according to a good practical example of this invention.
FIG. 30 represents the conversion code book of encoding and decoding algorithms of color code values according to a good practical example of this invention.
FIG. 31 represents a practical example of internet service information whose corresponding conversion color code values are indicated according to this invention.
FIG. 32 represents a practical example of Internet network service information and server address information whose corresponding conversion color code values can be indicated according to this invention.
FIG. 33 represents a practical example of details, which were saved in the database of users who want to receive data of the server according to this invention.

FIG. 34 represents a practical example of details, which were saved in the internet network service database of the server according to this invention.

FIG. 36 is an operation process flow diagram that represented the process in which a provider of authority receives services by using the internet network service with a color code value algorithm according to this invention.

Figure 1:
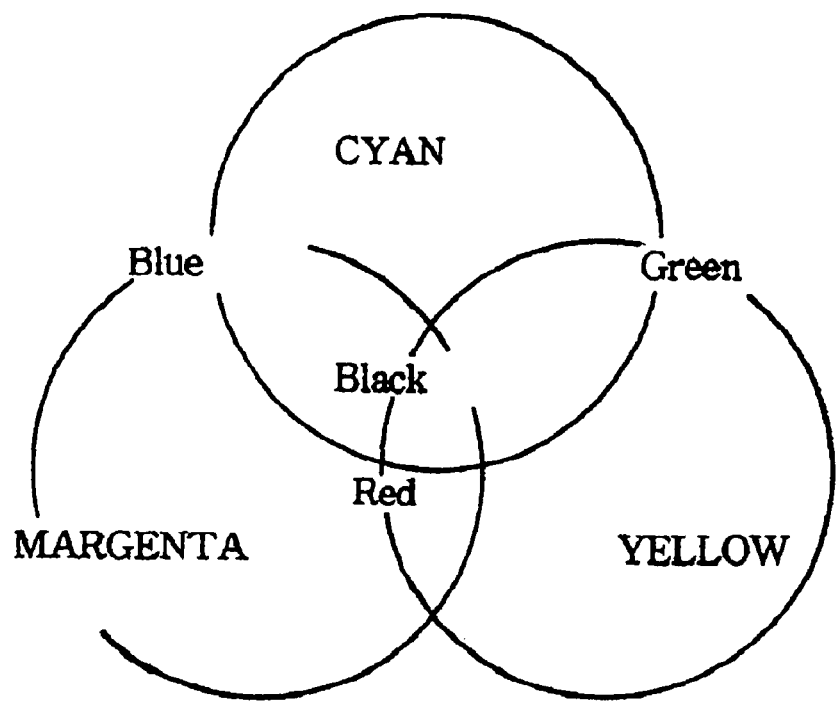
Figure 2:
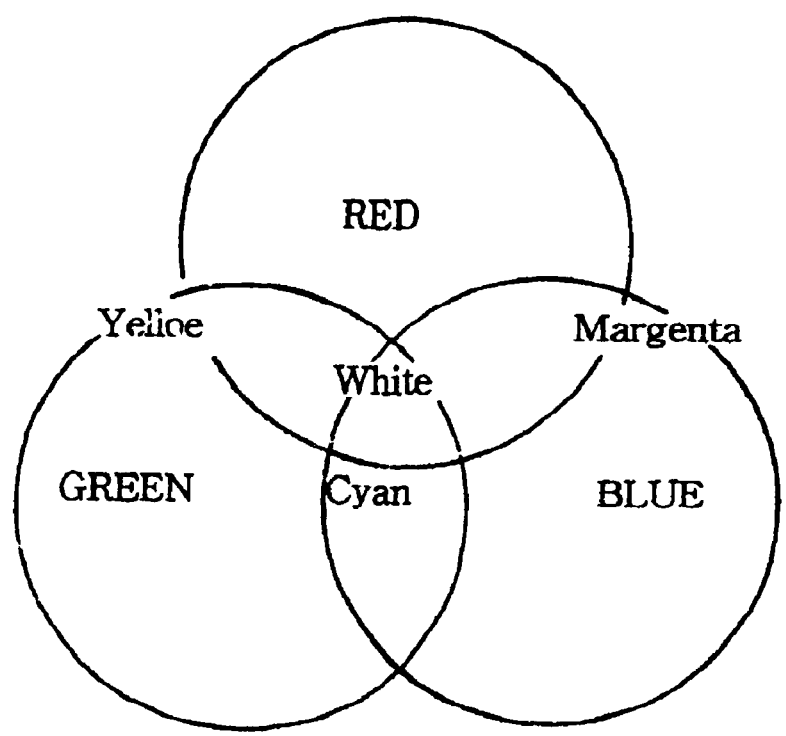
Figure 3:
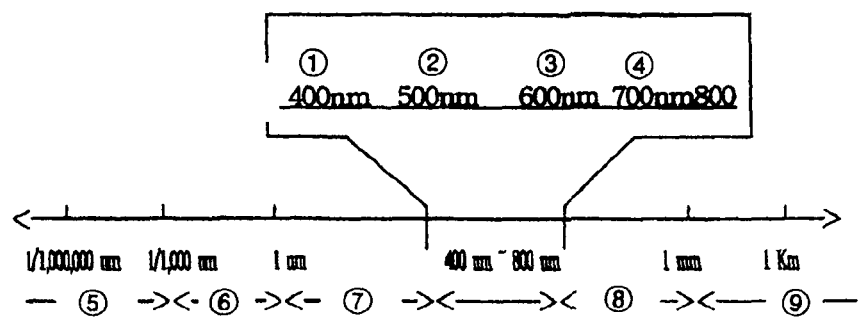
Figure 4:
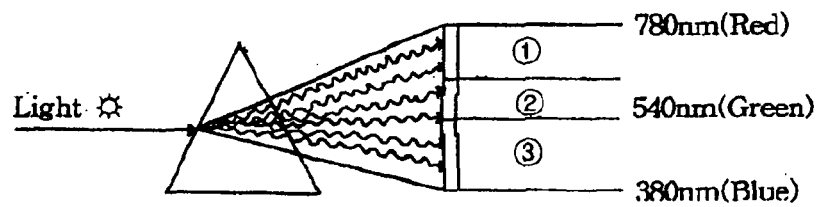
Figure 5:
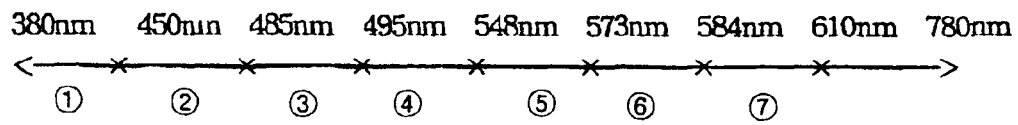
Figure 6:
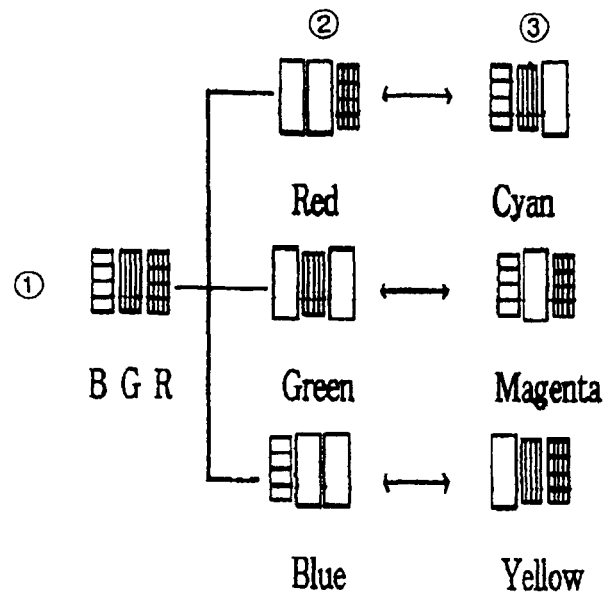
Figure 7:
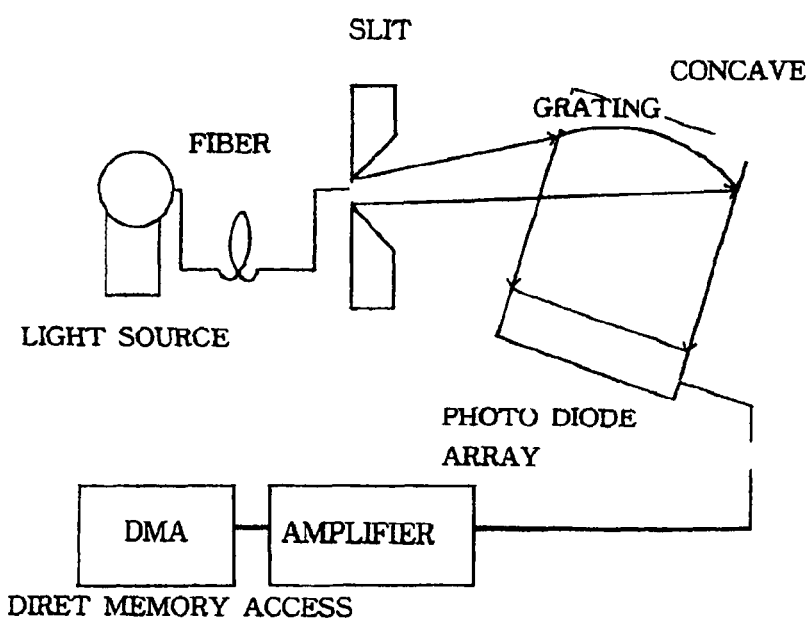
Figure 8:
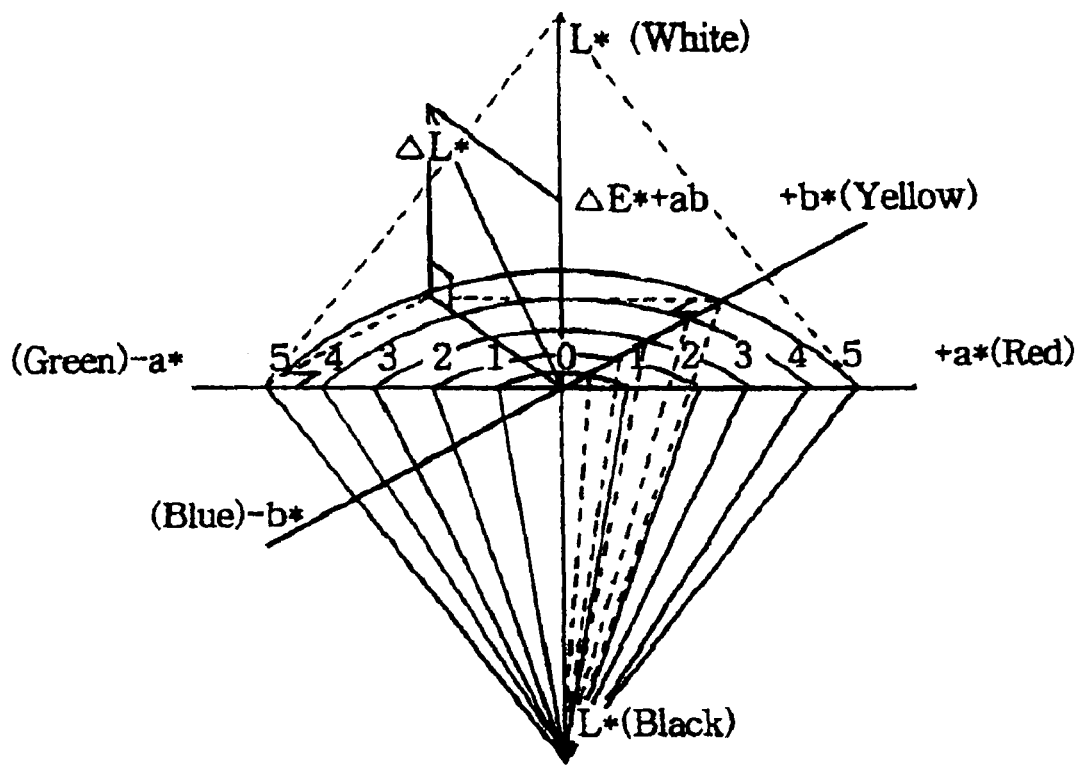
Figure 9:
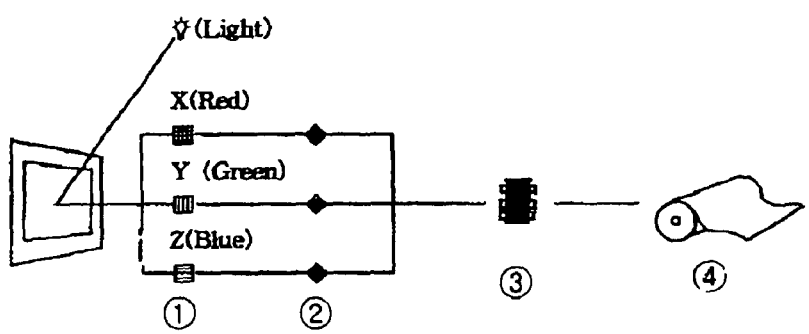
Figure 10:
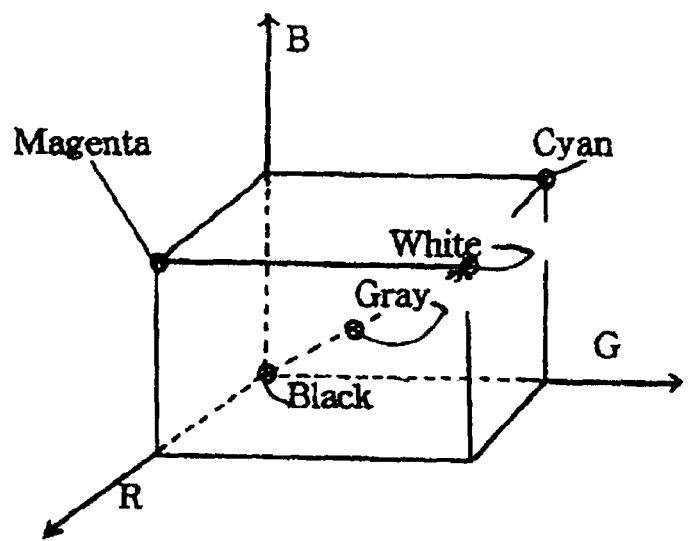
Figure 11:
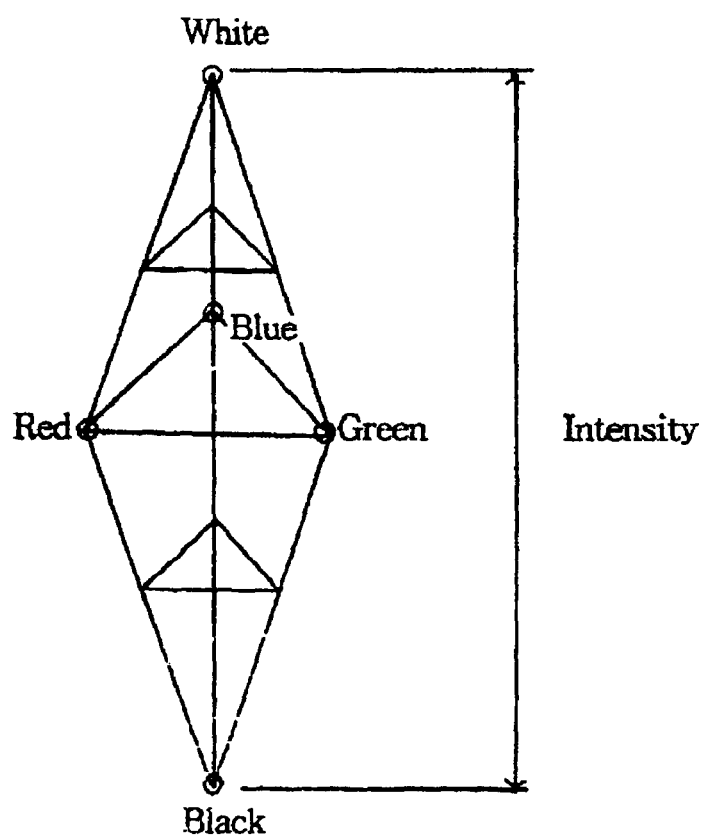
Figure 12:
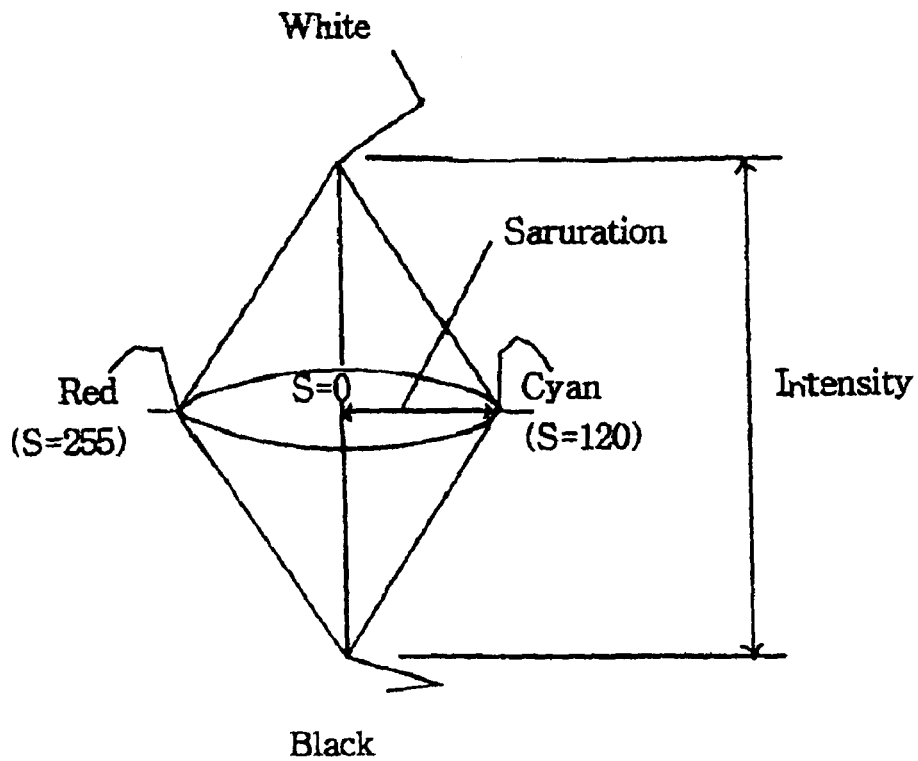
Figure 13:
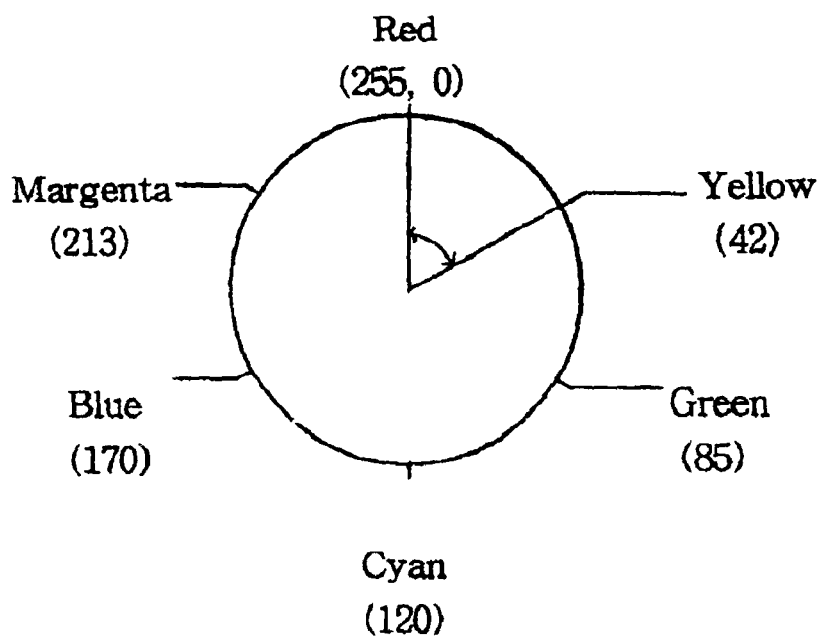
Figure 16:
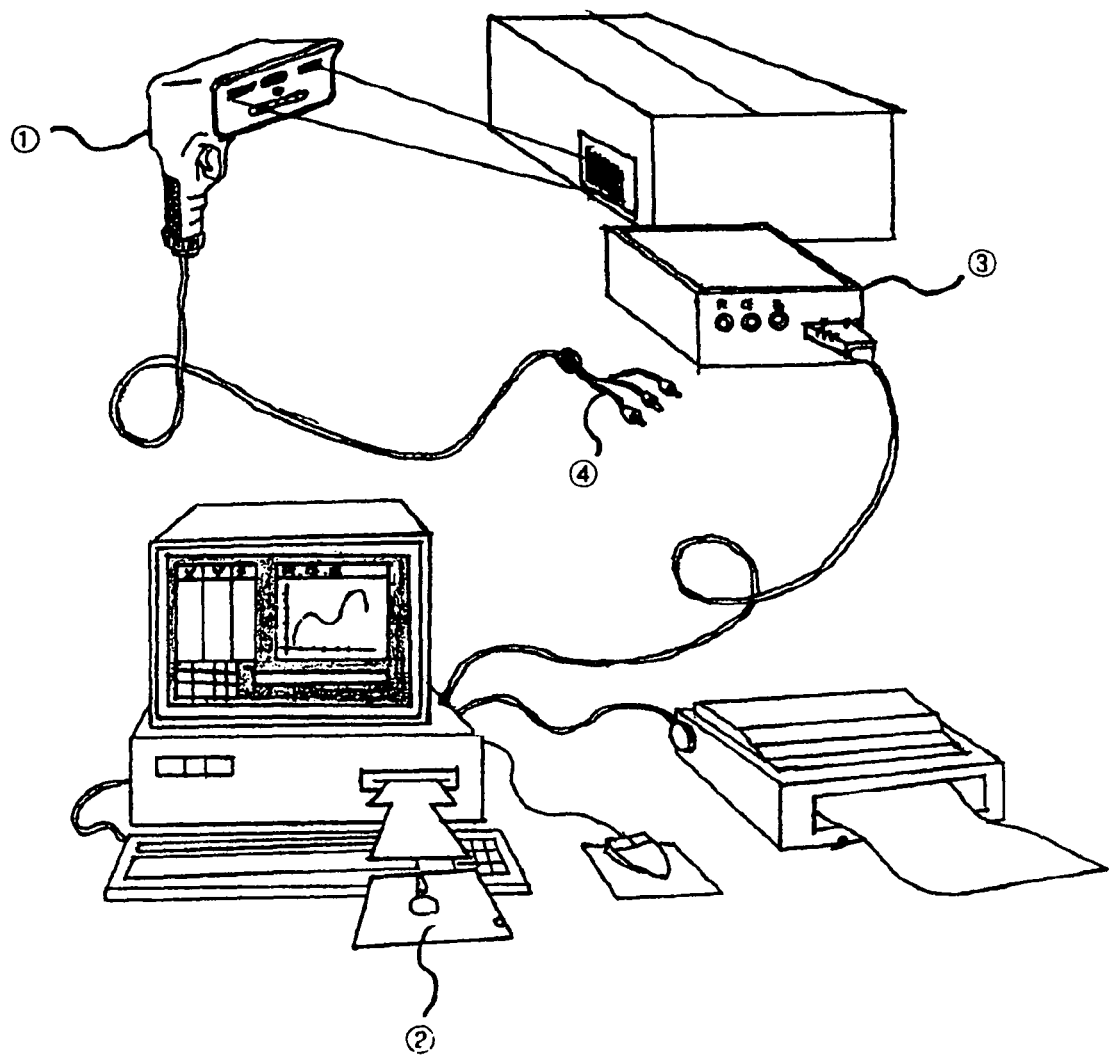
Figure 17:
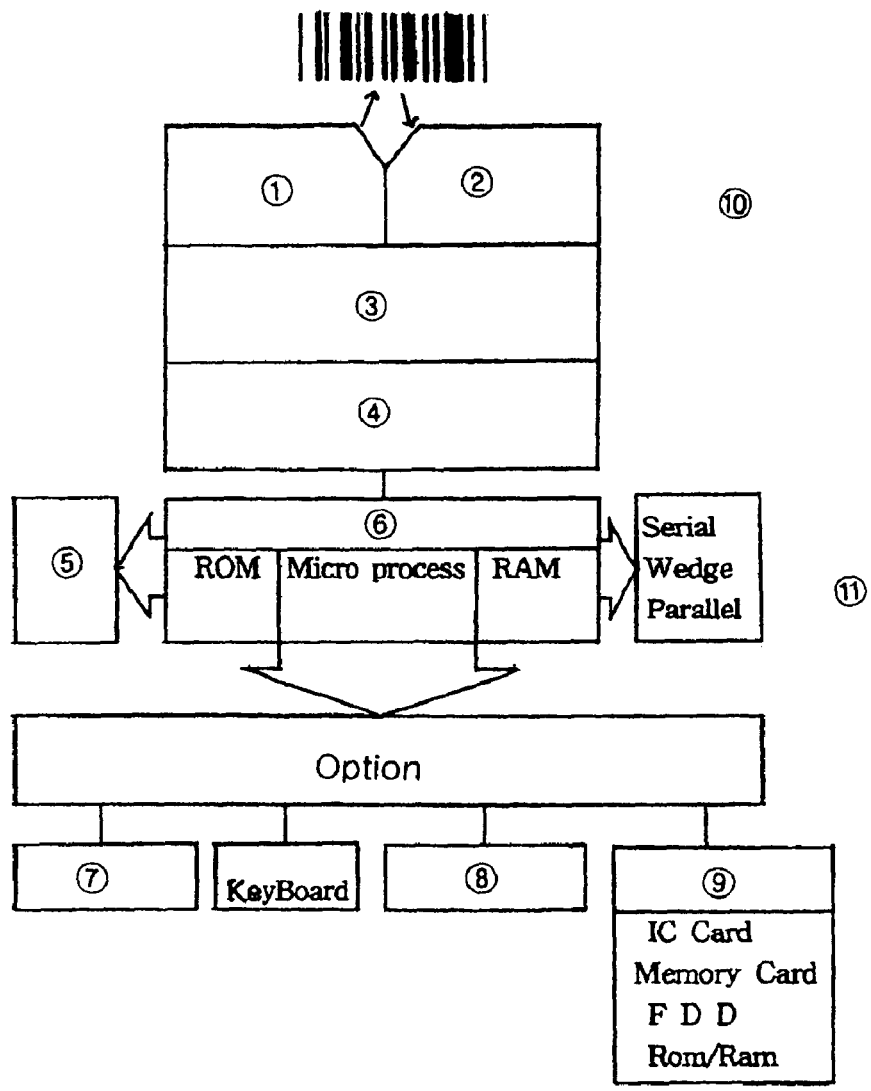
Figure 19:
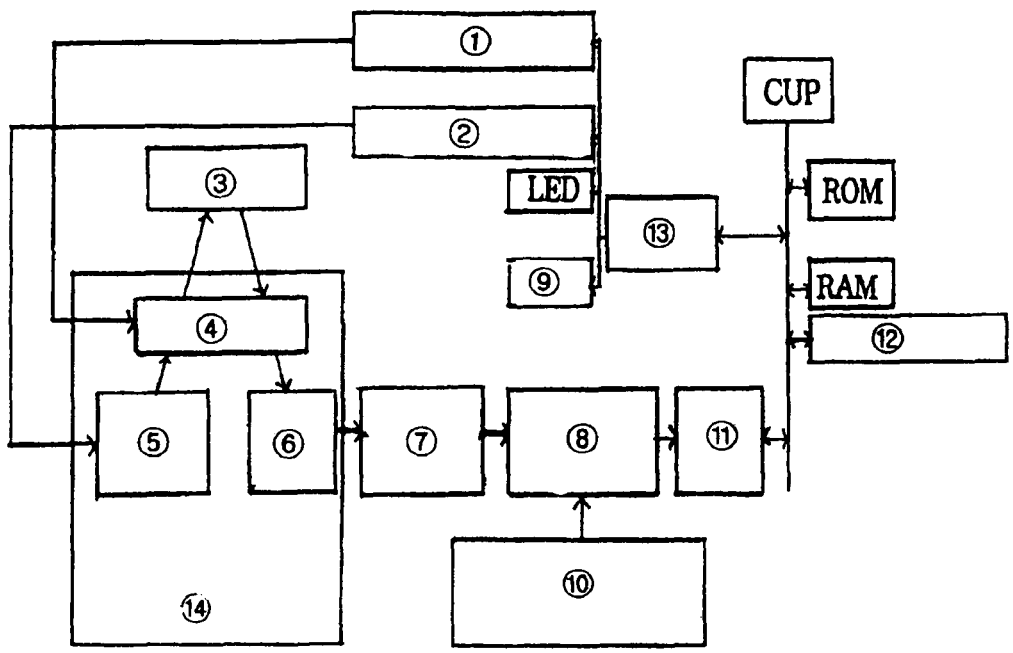
Figures 21, 22:
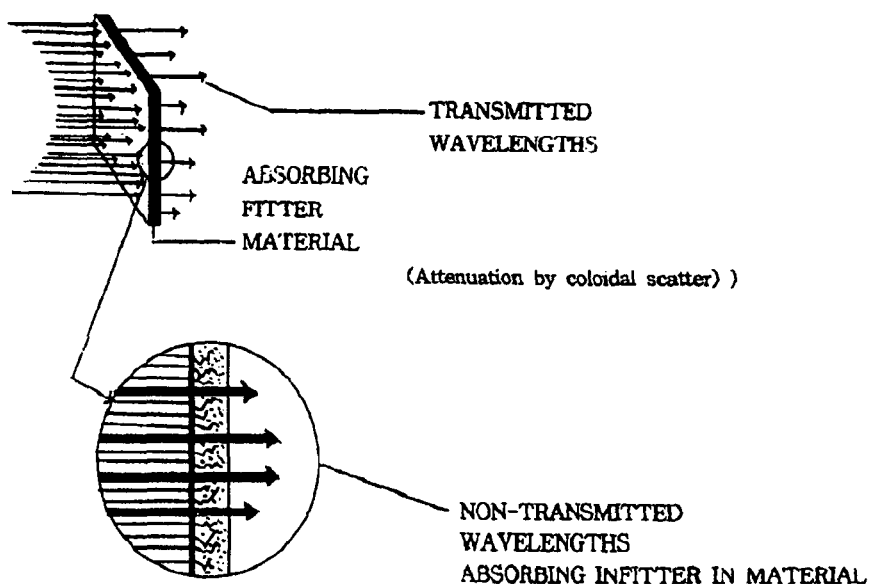
Figure 23:
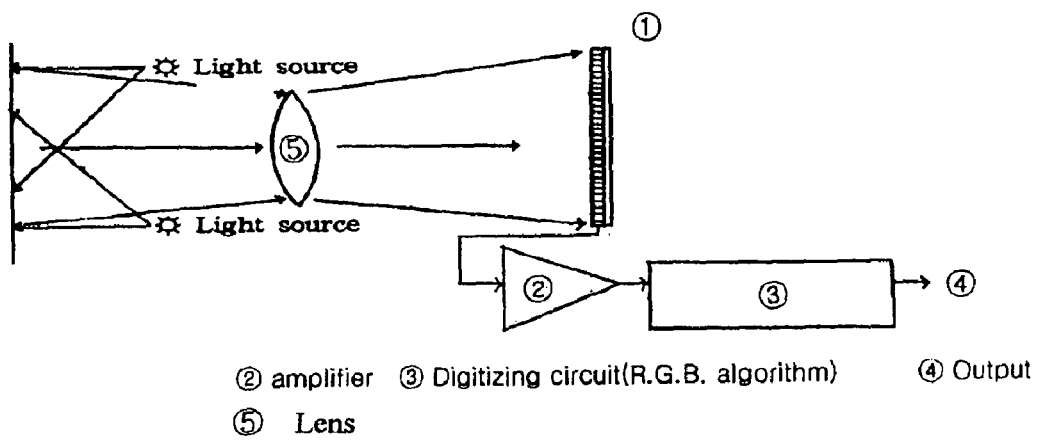
Figure 24:
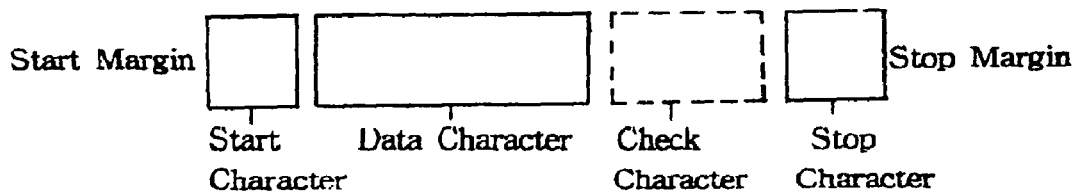
Figure 25:
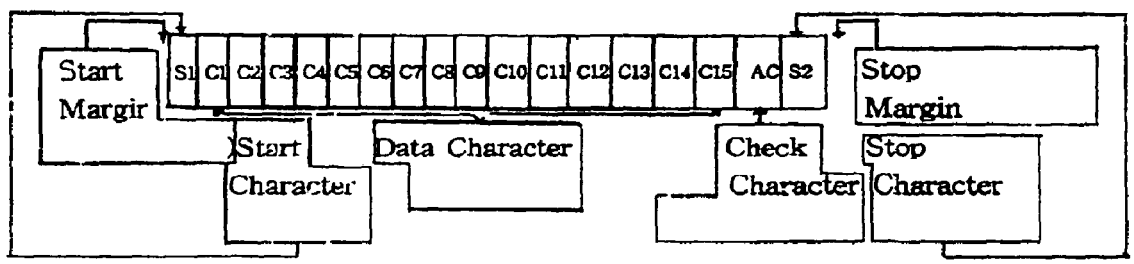
Figure 27:
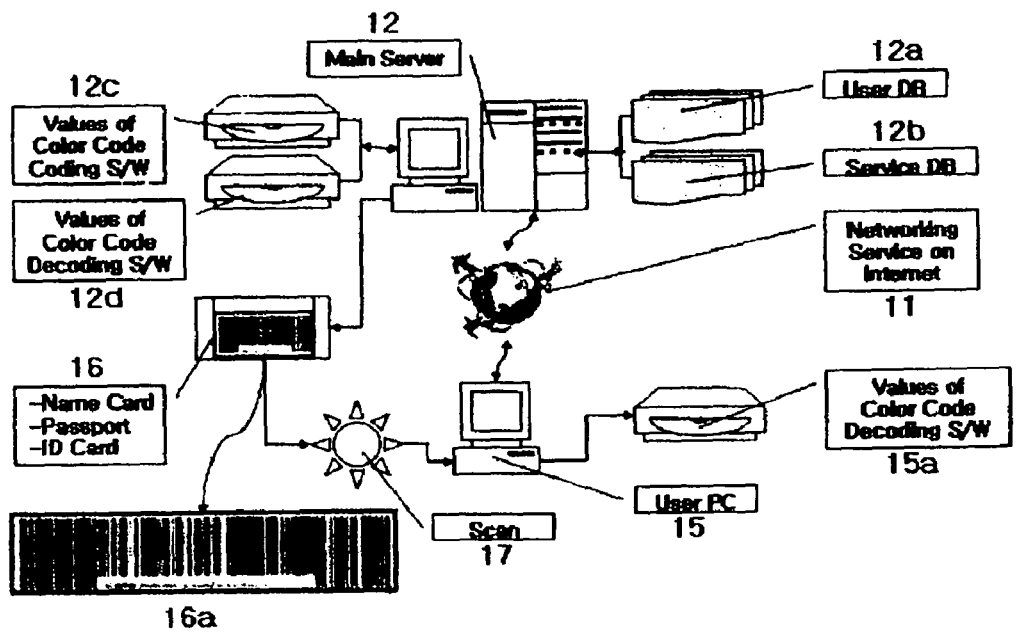
Figure 28:
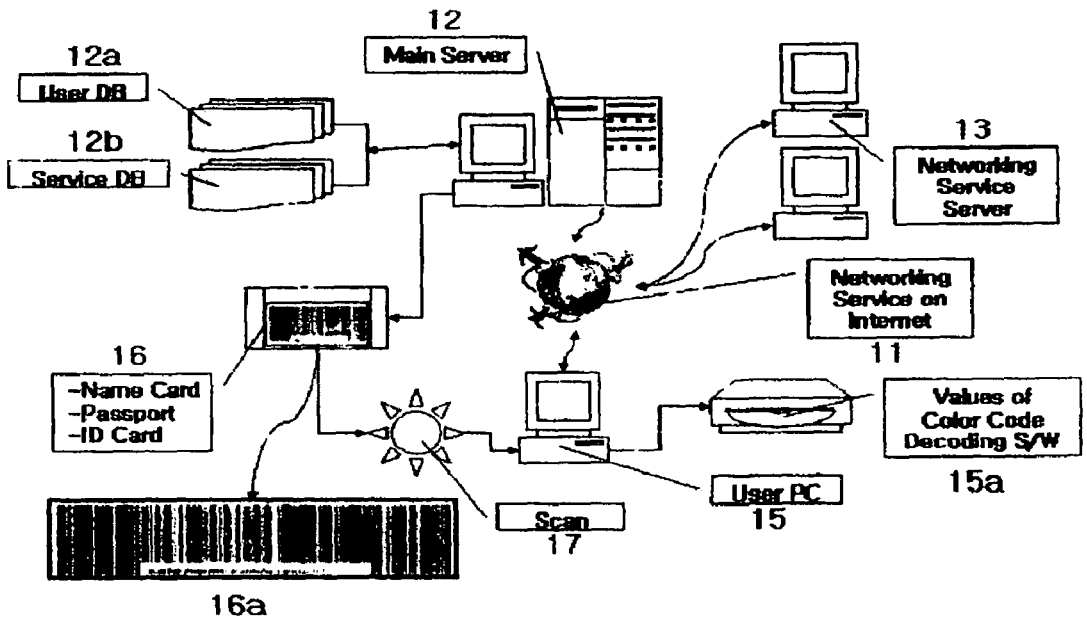
Figure 29:
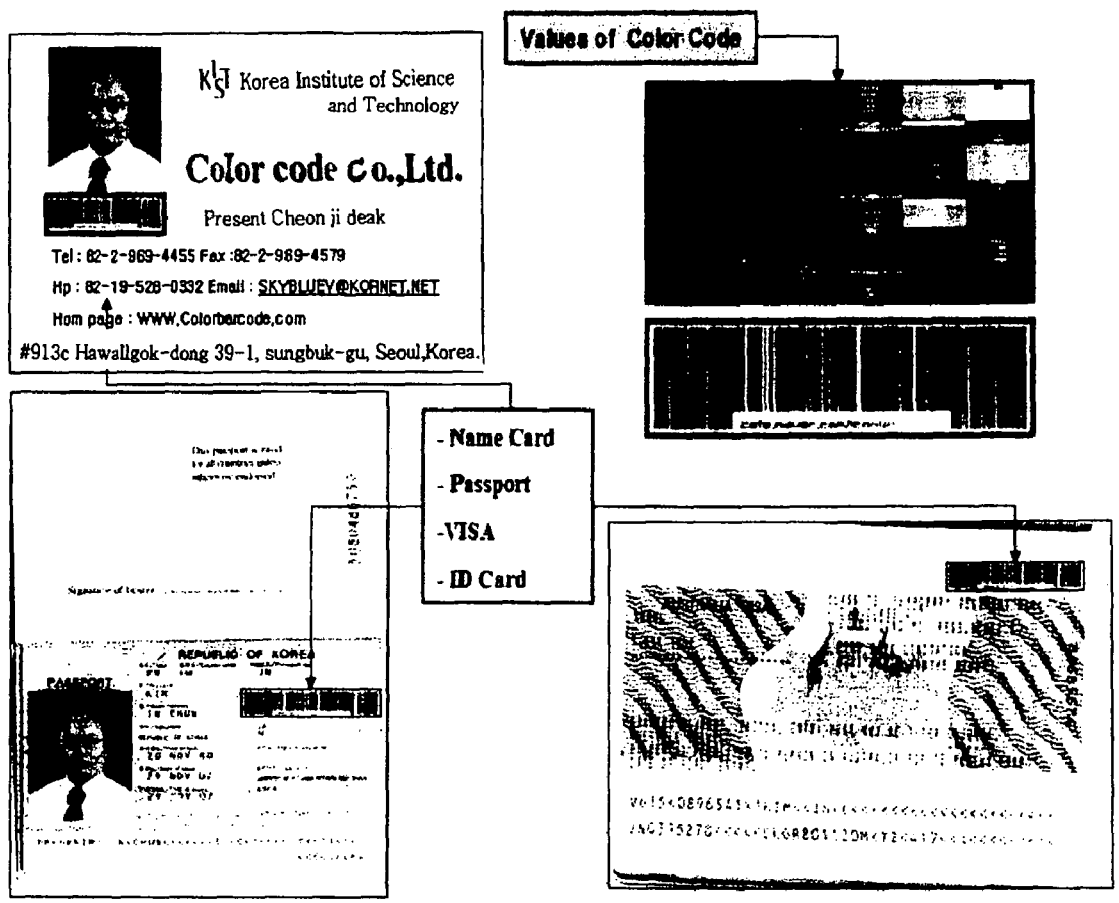
Figure 35:
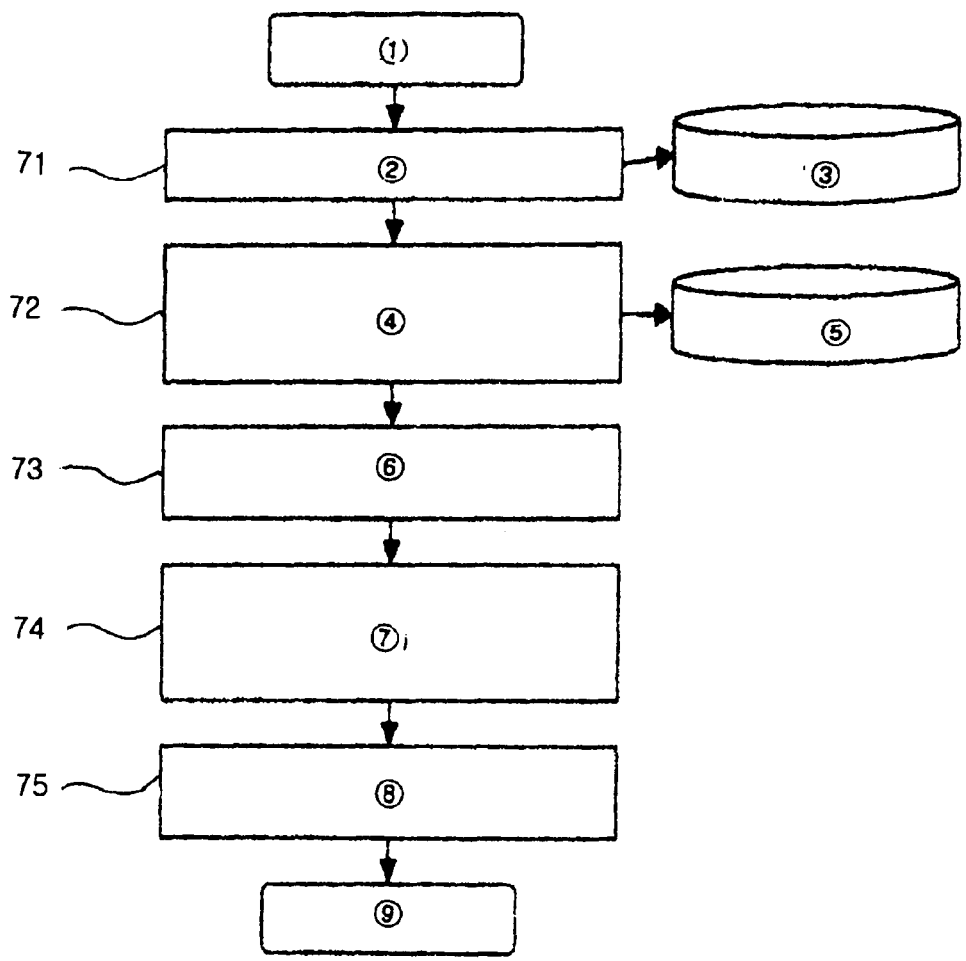
FIG. 35 is an operation process flow diagram that represented the process in which a provider of authority receives services by using the internet network service with a color code value algorithm according to this invention.
Figure 37:
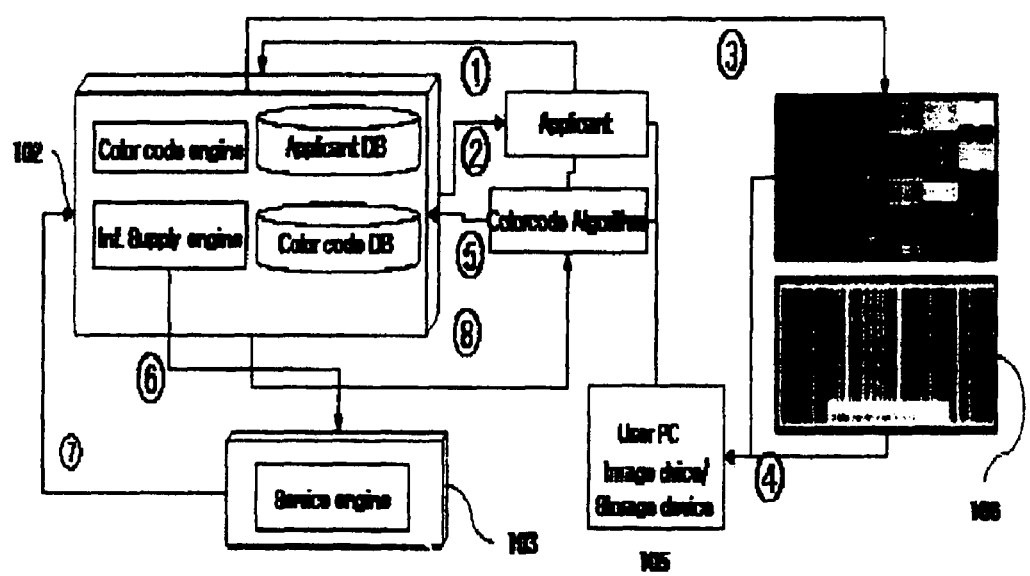
FIG. 37 is a tree diagram of system whose internet network service server is a single type according to the desirable practical example of this invention.
Figure 38:
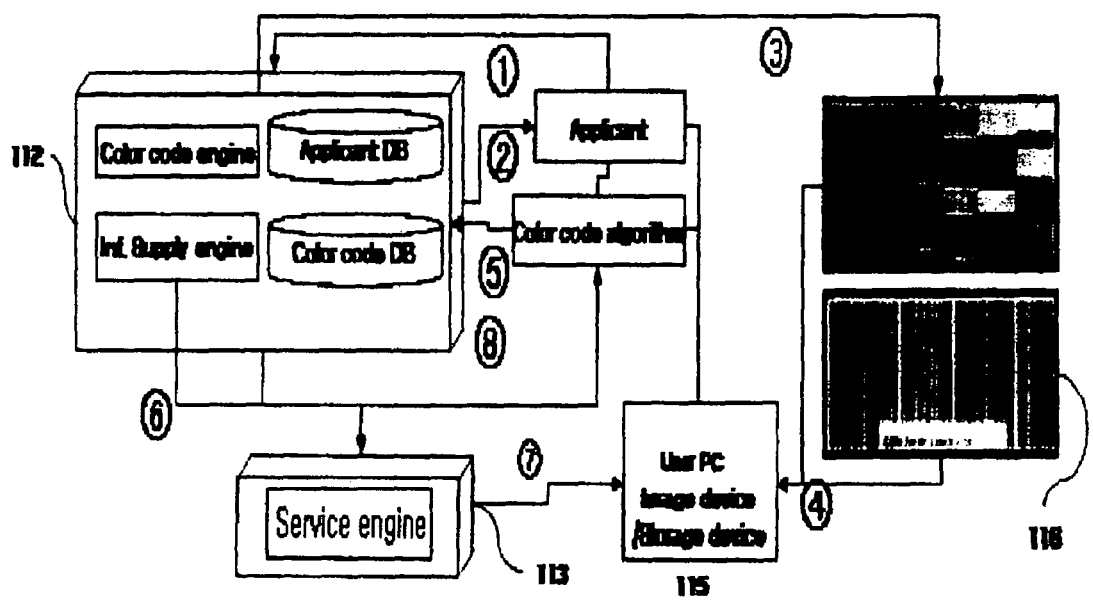

FIG. 38 respectively represents an internet network service sever and a system tree diagram of a different configuration according to the good practical examples of this invention.

Figure 39:
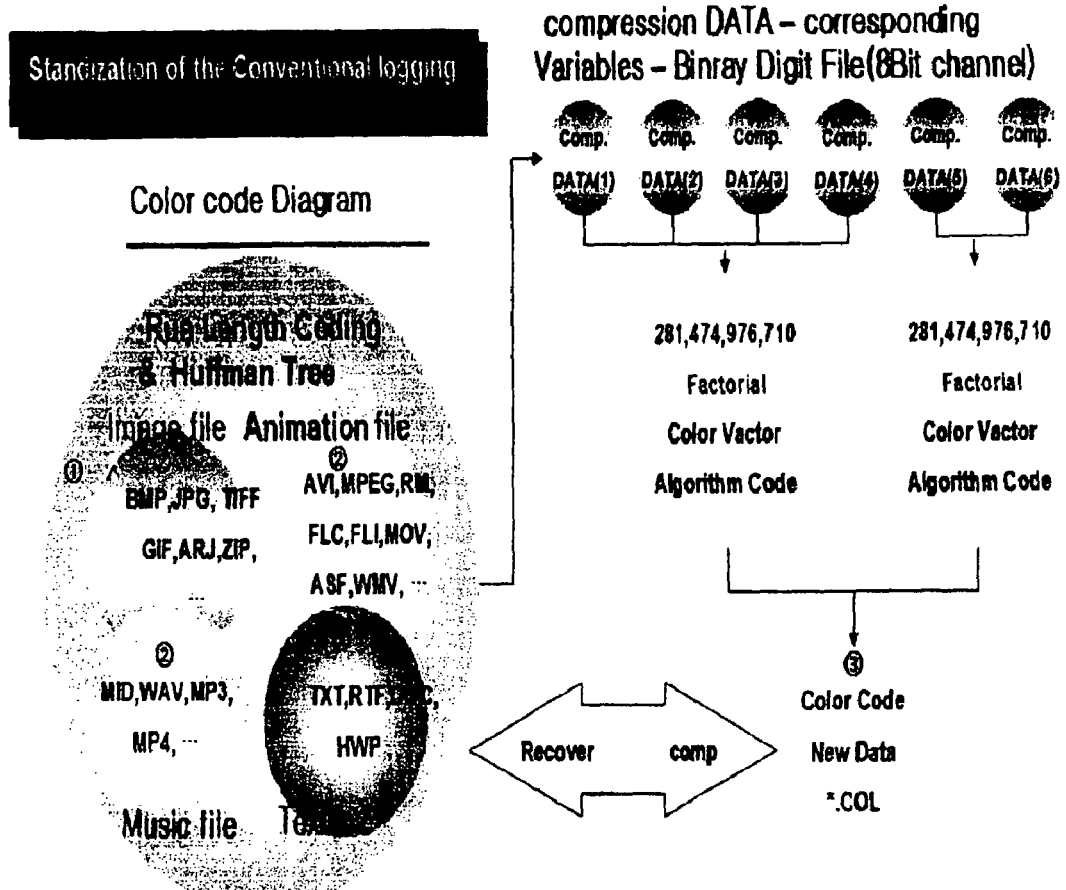

FIG. 39 is a concept map where the color code value of a conventional compressed file of this invention, which is recognized electronically, is compressed so that the compressed file is changed into a restored file.

FIG. 40 is an example table of the algorithm that converts the program, document, image, music, motion picture file of this invention, which are electronically recognized, into the ASCII code, which can be recognized mechanically, or converts the binary digit variable value into the color code value of 16 bit channel(Html, $C_{++}$) so as to be made to correspond to a compressed file.

STRUCTURE OF THE INVENTION

The good practical example of this invention will be described below in detail with reference to attached drawings.

In order to understand the algorithm of R.G.B barcode according to this invention, the principle of optics should be understood. First, a light means a natural light, that is, the sunny light. Also, artificial lights, that is, general media such as incandescent light, fluorescent light, candle light, and match are defined as lights.

When drawing 1 and drawing 3 are referred, the R.G.B mode values are extracted from the color matrix system printed in C.M.Y.K mode by using a spectrophotometer after the corresponding value of nano meter of reflected wavelength of each R.G.B in visible rays, where colors can be distinguished, is analyzed and detected.

Therefore, in the opto-electronical channel of R.G.B mode, if it is electronically represented, 8 bit colors per channel, that is, 256 colors, which is 8 square of 2, is used. Accordingly, as for the range of each channel of R.G.B that can be represented, it is possible that R(Red) 256*G(Green) 256*B(Blue) 256=16,777,216 colors are electronically represented.

These colors are the maximum colors that can be distinguished by human eyes. In fact, to represent electronically, if as a 16-bit channel, the values of 65,536 colors, which are 16 square of 2, correspond to the R.G.B. mode, as many as 281,474,976,710 colors can be represented. However, the representation of more than 8 bit channel is not needed, so it doesn't need to use 16 bit channel. However, if more massive data are required, 16 bit channel can be applied so that the electronic mechanical representation can be made.

In this invention, in order to unify the detector, which received the reflected light through a light-emitting device, first, the basis for measuring the standard color should be decided. The "CIE" standard light of the International Commission on Illumination was decided as the basis light source for measurement of optical spectrum. Among them, as the standard light that will be used to measure a barcode, D65 (color temperature 6,504K) and D 50, which is the color temperature for printing only (5,000K) are decided as the basis light source for measurement.

As a reference book, "Innovated color mechanism" written by Kim Yong Hoon (printed of Beopmunsa publishing company, Jan. 10, 1998, 41,66~83,93,97 pages) can be referred to. If Drawing 6 is referred, R.G.B. of three primary colors of light and C.M.Y of three primary colors of colors are correlated as relations of complementary colors with each other. When the color light of objects is measured by L*a*b* color order system by using a spectrophotometer, the values of color measurement spectrum distribution (for example, in case of an apple, the coordinate value is as follows: L*=43.31, a*=47.63, b*=14.12. In case of lemon, L*=75.34, a*=4.11, b*=68.54) can be color-measured by using the average coordinate values.

As an optical device of today, "Spectrum measurement, color measurement machine" is developing day by day, and its size is reduced more and more. Also, it became the product that can be portable and it is getting to be more precise. As a reference book for this, there is a book titled, 'Development of color measurement technology for processing color image, written by Yoo Seong Gyu, Jeong Gi Ryong, Jeon Byeong Heok, Kim Chang Soon (Korea Research Institute of Standards and Science, 1977).

When Drawing 7 is referred, just as we can see in the optical spectrum color measurement analyzing device, a light source, which was received to the detector of optical fiber through the light emitting device of optical light source (standard light source), went through the spectrum process by a spectrograph, and this light source is detected by 1,024 channel array detector. Then, it is amplified by an amplifier. The amplified data value is converted into the digital signal by 12 bit A/D converter, and saved in DMA to be transmitted to the computer. This is the spectrum measurement flow chart.

Meanwhile, the CIE makes L*a*b* color order system the basis of color specification for standard color difference the most widely used in the academic circle. As shown in Drawing 8, the calculation method of color difference is as follows;

$$\Delta E*ab=[\Delta(L*)2+\Delta(a*)2+\Delta(b*)2]^{1/2} \qquad \text{Mathematical Formula 1}$$

Here, Δ indicates the difference of two colors, and Korea stipulates it as KSA0067.

When Drawing 9 is referred, as for a barcode displayed by a physical measurement method, from the light source reflected through the light-emitting device, (x, y, z) values of R.G.B is calculated in the detector. Then, the values in proportion to the color function such as the CIE color order system "should be calculated into L*a*b* by the entire optical spectrum characteristics of filters.

The R.G.B barcode, which is represented variously on the basis of CIE color order system, is read by a high-resolution scanner and went through spectrum process to be color-measured. Then, when the image of the read vector values is expanded, the remained colors that can not be viewed by human eyes can be shown. These phenomenon can have distortion of colors due to the diffuse reflection of background colors, and according to the qualities of printing materials, many noises can occur.

Due to these characteristics of color vector images, not the conventional binary image or binary coded multilevel image but the pre-processed algorithm is required. That is, an image is processed by the measurement R.G.B value by the printout of C.M.Y.K., and since all of brightness and colors are related to the R.G.B. value, it is very difficult to independently measure and process each of R.G.B value just like with sense of human eyes. Therefore, the R.G.B barcode, which is represented in the R.G.B value, is entered and H.S.I (Heu. Saturation, intensity) value is converted into the coordinate value and then the color is measured in the given image. For measuring the color, the colors of the R.G.B barcodebar should be separated from the neighboring color bar and should be measured by using additional algorithms. In order to measure the similar degree between two colors by using the H.S.I coordinate system, the following function calculation method is used; through the distance function of colors, not by comparing numbers simply but by obtaining exact functional value, the function value should be made to correspond to the location value of CIE color order system.

Therefore, the structure of H.S.I color solid (Refer to drawing 11) can be modeled on the basis of the R.G.B model coordinate system shown in Drawing 10 and as for the characteristics of H.S.I color, since the components of color and saturation are similarly related to the color recognition method recognized by humans, it is needed to convert the R.G.B value received to the detector of a scanner into the H.S.I value. The conversion formula is as follows;

$$I = \tfrac{1}{3}(R+G+B) \qquad \text{Mathematical Formula 2}$$

$$S = 1 - [3 \div (R+G+B)] \min(R.G.B) \qquad \text{Mathematical Formula 3}$$

$$H = \operatorname{Cos}^{-1}\left\{\tfrac{1}{2}((R-B)+(R-G))\right\} \div \left[((R-G) + (R-B)(R-G))\tfrac{1}{2}\right] \qquad \text{Mathematical Formula 4}$$

When the above mathematical formulas are applied, R.G.B value has the range of [0, 1], and I and S also have the range of [0, 1], and H has the range of [0, 2 π]. The value of HEU is represented as 0 degree, R(Red) is as 360 degree, G(Green) is as 120 degree, and B(Blue) is as 240 degree.

When Drawing 11 and 12 are referred, as for the color that be owned by the Hue value, as the saturation value is decreasing, the color is getting close to white color, and as an intensity value is decreasing, the color is getting close to black color. Exceptionally, when the intensity value is "0", the hue value is not defined. Also, in case of hue, if "B/I is greater than G/I, H=2 π-H.

Therefore, since H.S.I can be converted into R.G.B, the conversion value is as follows;

When 0°<H≦120°:

$$b = \tfrac{1}{3}(1-S) \qquad \text{Mathematical Formula 5}$$

$$r = \tfrac{1}{3}\{1+[S \cos H \div \cos(60°-H)]\} \qquad \text{Mathematical Formula 6}$$

$$g = 1-(r+b) \qquad \text{Mathematical Formula 7}$$

120°<H≦240°:

$$H = H - 120° \qquad \text{Mathematical Formula 8}$$

$$r = \tfrac{1}{3}(1-S) \qquad \text{Mathematical Formula 9}$$

$$g = \tfrac{1}{3}\{1+[S \cos H \div \cos(60°-H)]\} \qquad \text{Mathematical Formula 10}$$

$$b = 1-(r+g) \qquad \text{Mathematical Formula 11}$$

240°<H≦360°:

$$H = H - 240° \qquad \text{Mathematical Formula 12}$$

$$g = \tfrac{1}{3}(1-S) \qquad \text{Mathematical Formula 13}$$

$$b = \tfrac{1}{3}\{1+[S \cos H \div \cos(60°-H)]\} \qquad \text{Mathematical Formula 14}$$

$$r = 1-(g+b) \qquad \text{Mathematical Formula 15}$$

Here, R=31r, G=31g, B=31b can be calculated so that each of r.g.b can have the range of [0, 255].

The barcode, which was applied as the conventional technology until today, has the limitation that the reflecting rate of light is encoded as the binary digit of white and black and applied. It is realistic to produce values by separating the barcode vector and standardizing it through the color image segmentation by using the color vector segmentation and to make the value calculated according to the data value of algorithm. This is the established analysis theory in an optical analysis theory.

In order to distinguish the object from background, until now, only the brightness information has been used in the black and white image, and also, when objects have similar brightness of color images, it was not easy to zone the color image. Since humans have excellent abilities of distinguishing brightness and colors, the characteristics of the human ability is called "color image segmentation", and the information can be saved as data by using this human ability.

That is, the visible ray wavelength of range of 380 nm to 760 nm is detected by 1,024 channel array detector, and from the data value produced by the detector, the calibration factor value for each wavelength of measured visible rays is obtained as we can see in Drawing 14 and 15.

The decoding algorithm flow chart of R.G.B barcode that used the C.I.E color order system according to this invention can be systematized and applied as we can see in Drawing 16 and Drawing 17.

As for the development of equipments, in case of an optical device, data algorithm, scanner, and printer of the conventional application area, each equipment, which is used in the application area that was separated and developed, can be systematized and integrated. The scanner is based on the application of CIE color order system according to this invention, so the standard light should be designated in the optical area and the light-emitting of the light-emitting device should be emitted as the standard light in order to avoid the interference of lights.

However, in order to make the CIE color order system have access to the R.G.B barcode, 1,6770,000 colors can be represented, but considering that the classification of area can have an error rate by color measurement corresponding to the C.M.Y.K value, its representation range can be reduced in the algorithm itself.

In that the range, which can be represented by classification of the C.M.Y.K chart of mixed colors of the percentage, which is designated in the Fapa's Korea Standard Color Chart, represents 9,317 types of colors, we can see that the variable representation ranges are more different than the existing barcode representation variables values.

When Drawing 17 is referred, as we see in the existing barcode reader structure, the roles of a laser scanning and a detector are different, and when the amplified signal is converted into the digital signal, the algorithm can make the interference of lights avoided by adopting the light source for international standard printing such as "CIE standard light (D65, D50)".

When Drawing 18 is referred, as for the merits, the compatibility is secured so as to be similar to a general barcode reading process, and the problem of error about the reflecting value of black and white read by the scanner spot is resolved, so that the occurring rate of misreading rate about the FRR (First Read Rate) also can decrease greatly.

Here, the reading rate is produced when the firstly scanned data are divided by a total numbers of scanning. The misreading rate is produced when the error characters are divided by the numbers of read characters. The cause for FRR and SER are various, but the representative ones are the printing, optical noise (surrounding light, interference of surface reflecting rate, surface damage), error of operator, error rate of decoding algorithm, and these problems are not complemented perfectly by the technology of today.

The decoding algorithm of R.G.B barcode using C.I.E color order system according to this invention is developed into the algorithm that can decrease FRR and SER. Also, since the conversion is made into the data value whose color was measured simply by measuring the RGB barcode, if the printing method, which was decided by the C.M.Y.K value of the CIE color order system, is distinguished from the printing standardization and if the data are read in the spot designation direction of a scanner, the complex error rate problem like above can be greatly resolved.

In addition, it is an important problem to detect the boundary value of vector for each bar of R.G.B. barcode and divide it up, but if the color bar vector boundary is detected and divided up, the brightness state is changed by using the following formulas regarding the color bar vector information.

$$I = 0.3R + 0.59G + 0.18 \quad \text{Mathematical Formula 16}$$

$$C1 = R - I \quad \text{Mathematical Formula 17}$$

$$C2 = B - I \quad \text{Mathematical Formula 18}$$

$$H = \text{Tan}^1(C1 \div C2)(\text{Color=Values between 0~360 degree}) \quad \text{Mathematical Formula 19}$$

$$S = (C1^2 + C2^2)(\text{Saturation}=0\text{~}255) \quad \text{Mathematical Formula 20}$$

By applying the conditional expression of the following;

$$\nabla^2 F = \{[\partial^2 F \div \partial x^2] + [\partial^2 F \div \partial y^2]\} \quad \text{Mathematical Formula 21}$$

If laplacian filter, which is defined in a quadratic differentiation like the above mathematical formula 21, is used, when F(x,y) is a constant or changes fanwise, the algorithm by which the boundary value of 0 can be detected, is applied to the data algorithm. Then, the color bar vector boundary can be detected and divided up. The separation of colors in the boundary detection of Laplacian indicates followings; In color bar vector, the boundary should be extracted from the color measurement and the boundary from which color measurement was extracted should be determined. Then, by input-image masking for the color vector image, which was determined during the clustering process, non-homogeneity can be eliminated. Also, by distributing the image whose surrounding background was eliminated, on the clustering center value, which was exactly separated, so that the image can have a minimum function distance, the binary image can be separated exactly.

The boundary indicates the part where two areas with relatively different gray levels adjoin, and also indicates the algorithm that eliminates non-homogeneity of colors, which exist in this boundary, or groups into similar colors in order to separate colors exactly.

As mentioned before, the method of applying a decoding algorithm of R.G.B barcode, which used C.I.E color order system according to this invention, to a barcode is very simple. The words and vocabularies of an electronic dictionary generally used by us are composed of about 1,060,000 words and vocabularies, and they are standardized; For computer information area, 120,000 words, for electricity and electronics area, 40,000 words, for the mechanical area, 60,000 words, for civil engineering and construction area, 40,000 words, for metal polymer area, 20,000 words, for physics area, 50,000 words, for astronomy and meteorology, 20,000 words, for economics and finance, 40,000 words, for trade and business, 40,000 words, for math, 30,000 words, for place names and person's names, 100,000 words, for medical science, 250,000 words, for pharmaceutical area, 30,000 words, for internet terms, 50,000 words, for environment area, 30000 words, for military and defense, 30,000 words, for aerospace engineering, 40,000 words, for agriculture and biology, 40,000 words, for chemical area, 70,000 words, and for atomic energy, 30,000 words.

16,770,000 color vectors can be used by the R.G.B. vector expression according to this invention. In this point, the area where sentences are represented can be limited roughly to one tenth area. Since we can see that the sentence can be represented by being limited to the area of one tenth area, the algorithm available for each field can be integrated and materialized.

Therefore, since words and sentences for each nation can be made data for the color vector values and applied by using R.G.B color barcode vector values according to this invention, not simply barcode for business circulation information but the barcode for sentences can be realized. That is, limitless area can be represented.

The purpose of this invention is to convert limitless characters data into the shortest data and process them. On the present barcode printing basis, when considering the symbol density of each symbology, the high density indicates more than eight characters per inch (less than 0.23 mm/unit), and middle density indicates four to eight characters per inch (0.5-0.23 mm/unit), and low density indicates less than four characters per inch (0.5 mm/unit). These are presently used module dimensions.

Therefore, the algorithm can enable its data to have each word and sentence value so that the reflected light of R.G.B visible ray of CIE color order system can correspond to the wavelength value of standard light, so the symbol letter pattern of Code 39 of the existing Drawing 21 is used for representation in order to make the sentence "Good morning" barcode of high density as follows;

(G=000110010, O=101000001, O=101000001, D=001000010,

Space=01010 1000, M=110000001, O=101000001, R=100100001.

N=00100001, I=010100010, N=001000001, G=000110010)

When binary "X" dimension unit is a basic unit density, "Start Char" 12 "X" dimension and "Stop Char" 12 "X" dimension should be assigned as basic modules within from the left quit zone to right quiet zone. Therefore, since the wide-width is decoded as "1", and the narrow-width is decoded as "0", the addition of whole "X" dimensions require followings;

"Sentence" 144 "X" Dimension
+ "Start Char" 12 "X" Dimension
+ "Stop Char" 12 "X" Dimension
=168 "X" Dimension Therefore, the symbol of symbology of high density requires printing area of 0.23 mm*168=38.64 mm, and in case of symbol of symbology of low density, the printing dimension of 0.5 mm*168=84.00 mm is required.

When Drawing 20 is referred While the binary conversion process of barcode of conventional technologies has a demerit of occupying the character areas, since in this invention, each sentence area value is made to correspond to algorithm data and applied, even in case of low density, when an English sentence, "Good Morning" is applied to X-Dimension value, $$(\text{Good} = L(n)*a(n)*b(n)*,$$

$$\text{Space} = L(n)*a(n)*b(n)*,$$

$$\text{Morning} = L(n)*a(n)*b(n)*)$$

the following three "X" dimensions and the printing width of 0.69 mm are required. Also, another merit is that when sentences like "Good Morning" is applied to the data of "L(n)*a(n)*b(n)*'", only 1 "X" dimension is required, so the algorithm can be composed so that the printout representation is enabled by bar "X" dimension of within 0.23 mm-0.5 mm.

That is, a widely different difference can be represented in the sentence representation of R.G.B barcode decoding algorithm that used "Code 39" and "CIE color order system". As in the sentence, "Good morning", we can see a great difference of representation method in a ratio of module printing length of "X" dimension of 840 to 69, this invention can be widely applied according to the method that each wavelength area of light is classified and made data for the algorithm. Also, in this invention, the compatibility is enabled with the electronic document like general compatible IBM PC that is saved in a computer disk, so one-dimensional document can be made barcode, and the algorithm for barcode for documents can be realized.

In addition, the algorithm for management of disclosure of secret document and the algorithm only for management of documents can be realized, so that the third language that can be applied to information and communication, aviation and military area can be realized. It is the limitation of today's technology that a paper document is electronized and saved in the magnetic field disk. In this method of keeping documents, when data are damaged due to the interference of magnetic field or failure of keeping documents, there is no method to restore the document, and it is the technological problem of today.

According to this invention, since the electronized document or data can be made barcode, and in the method of keeping data, the conventional problems can be resolved, this invention can be an epoch-making method.

If the decoding process of this invention is compared on the basis of "2 of 5 codes", although the conventional decoding algorithm is different according to symbol, the decoding process is as follows;

<In Case of the Auto Process System>
Step 1. Measure the whole bar width
Step 2. Determine according to the higher order by using the measured data.
Step 3. Decide the greatest two data as "1" and remaining data as "0" in the measured values.
Step 4. Compound binary numbers in the unit of characters, and compose data by using them.

<In Case of the Real-Time Process Data>
Step 1. Measure the whole bar width.
Step 2. Obtain the width of neighboring bars and obtain the threshold-value.
Step 3. Compare the obtained threshold-values, and "1" is decided if a bar is greater, and "0" is decided if a bar is smaller.
Step 4. Compound the indicated binary numbers in the unit of characters and compose data by using them.

In the system process of this invention, the flow of a decoding process is as follows;

Step 1. Select the data to be printed as barcode from the ASCII code of entered data algorithm of CIE color order system of main computers.
Step 2. Convert the entered data into C.M.Y.K value as to meet the barcode symbol of a main computer and transmit them.
Step 3. Print the barcode by using the barcode printer only for R.G.B for obtaining labels.
Step 4. Attach labels to applied products.
Step 5. Read the barcode by using a scanner.
Step 6. Detect an optic wavelength value from the R.G.B photodiode of detector that received the optic signal (standard light) of light-emitting device.
Step 7. Receive the detected optic wavelength values and check start margin, stop margin, start character, stoop character, data character, and check character.
Step 8. The coordinate value of CIE color order system is decided according to the optic wavelength, and according as the coordinate is decided, the corresponding variable value is set.
Step 9. Decide the threshold value by using the measured value.
Step 10. Compare the threshold values and decide the error rate.
Step 11. By addressing the data of obtained barcodes, convert them into the target data to be printed.
Step 12. Transmit these data through a communication channel and print them.

This decoding process is different from the conventional decoding process, and through the filter of R.G.B photodiode of Step 6, each R.G.B is selectively filtered and scanned like Drawing 22, and then the optical signal wavelength is integrated and transmitted as data like Drawing 23 of the scanning process.

As we can see in Drawing 26, in the color theory, the area value of wavelength is symbolized so that the value can be nearly distinguished by human's eyes, in order to name the color, and the colors are named by dividing and sectioning wide area that is difficult to be distinguished electronically.

If the electronic optical representation is used, the calibration factor value of spectral diffraction response can be distinguished as shown in Drawing 14.

Step 1. Measure 1024 data of the intensity of spectal diffraction of light, which is emitted and reflected from the light-emitting, by a channel array detector.
Step 2. Since the measured 1,024 data are the data for each channel, these data should be made to correspond to the values for wavelength from 380 nm-780 nm.
Step 3. Correct the calibration factor of spectral diffraction intensity of the "array detector" in the measured value that corresponds to each wavelength.
Step 4. Organize the finally obtained value into a graph.
Step 5. Obtain the color values, kX, kY, and kZ, and color coordinate x, y.

In order to obtain the exact reflected wavelength, the calibration of optic light is needed so that the wavelength of reflected light can be applied to the color coordinate and spectrum. If the calibration method of optical wavelength, which is applied in the optical system, is applied, "the calibration factor value of spectral diffraction response for each wavelength" according to the optical wavelength value of visible ray can be obtained as shown in Drawing 14.

Therefore, the R.G.B barcode should be arranged as follows; the "Start margin" and "Stop Character" should be applied to the algorithm within the "Start Margin" and "Stop Margin" through specific colors. The algorithm data value should be printed out to be color R.G.B barcode by using the designated data variable value so that the algorithm data should be made number, character, or sentence in the calibration factor value as shown in Drawing 14.

As we simply see in Drawing 14, the color should be designated by the ratio of CIE color order system on the basis of calibration factor value, so that the R.G.B barcode is represented in the unit of 1 nm of optical wavelength. According to this method, 400 color code values of optical wavelength value of visible ray, 380 nm-780 nm, can be designated. Since in this "detailed statement", these descriptions should be schematized, if the above is described by using a table and by using the color names of Drawing 26, S1 of Drawing 25 indicates the start of bar, and S2 indicates the color that notifies the end of bar. For its example, S1 and S2 is designated as black color.

C1 of Drawing 26 is, as a color symbol that is a limited mark called as "bp bluish purple", used to widely designate the optical wavelength area as 380 nm-430 nm. Therefore, if these descriptions are symbolized and represented as "C1, C2, C3, C4, C5, C6, C7, C8, C9, C10, C11, C12, C13, C14, and C15" so that these descriptions can be represented as characters, the following sentences are the represented method of Drawing 25.

If the following English sentences are made R.G.B barcode according to this invention, that is, for the sentence, "Four score and seven years ago our fathers brought forth on this continent a new nation", the data values are made to correspond to algorithm for each word, if the algorithms as follows are supposed to be applied; "S1-

"C1=Four-C2=score-C3=and-C4=seven-C5=years-C6=ago-C7=our-C8=fathers-C9=brought-C10=forth-C11=on-C12=this-C13=continent-C14=a-C15=new-C16=nation", the R.G.B color barcode is arranged as follows;

"Black-bP-pB-B-gB-BG-bG-G-yG-YG-gY-Y-yO-O-rO-R-Check color-Black" However, at present, the multi-level type of barcode, "PDF-417" is used to represent the above sentence, but this representation also requires lots of quantities of dimension of printing margin, so in reality, the multi-level type of barcode is regarded as satisfactory only in that the scan reader is enabled and the document is made barcode.

If the sentences like above is represented in the "RGB color barcode", if 17 "X dimension" is used, they can be represented. Also, when the above sentences are highly closely printed, they can be represented in the width of 0.23 mm*17 "X dimension"=3.91 mm.

Here, the check color of color arrangement indicates as follows; The data saved in the algorithm area, where data, which are read between the black color of S1 and black color of S2 are made numbers or sentences, are recorded and printed. The algorithm should be realized so that when the algorithm is decoded, the threshold values are compared and the reading error can be detected.

Drawing 27 represents an example of the whole composition of the computer network system for performing this invention. The main server computer (12) provides the software (12c, 12d), where the encoding and decoding algorithms of data, whose color code value was provided related to the service about whether to provide the internet network service information, were materialized, to the person who wants to receive the information. Also, the main server computer lets the data, where the data on the person who will receive the data registered in the server, saved in the database (12a) and server of the internet network service. Moreover, the main server computer is equipped with the database for whether to provide the internet network service information (12b), where the human resources management information related to whether to provide the internet network service information to the person who wants to receive the user are saved (See Drawing 33 and Drawing 34).

The main server (12) is equipped with the following two software(s); The first one is the software (12c), where the encoding algorithm for generating the color code value by encoding whether to provide the internet network service information of the person, who wants to receive the internet network service information, by using the unit variable of the combination of color code values, were materialized. The second one is the software (12d), where the decoding algorithm for decoding the color code value of the first software and recovering it to the data regarding whether to provide the original internet network service information were materialized.

The computer of a user (15) can be installed beforehand by downloading the programs for encoding and decoding from the server computer (12). The program can be provided in the form of sole software package or in the form of plug-in for being used in the internet browser, or in the form of the chip of integrated circuit. Then, the user's computer (15) can perform the function of directly extracting the data regarding whether to provide the internet network service information by encoding or decoding the code value for the data regarding whether to provide the internet network service information, not through the server computer (12).

If the user's computer (15) does not have the downloaded program for decoding or encoding, the user's computer should perform decoding or encoding by being connected with the server computer (12).

The server (12) converts the data regarding whether to provide the internet network service information of the user into the code value by using the software for encoding. Then, the server indicates the converted code value in the media related to whether to provide the internet network service information, which can contain the data regarding whether to provide the internet network service information physically or electronically just like the media card regarding whether to provide the internet network service information, and sends it to a user. If you want to know more detailed examples of the data regarding whether to provide the internet network service information, please refer to Drawing 33 and Drawing 34.

In addition, the media regarding whether to provide the internet network service information are not only the physically printed media such as a name card, credit card, cards related to whether to provide an internet network service information of other service forms, employee card, but also the physically or visually recognizable media such as the electronically recognizable picture like graphic files (for example, the media indicated in the electronically recognized data in the unit of mixed cells composed of cells and combinations in the form of binary digit data with HTML, C++, RGB color code value for 281,474,976,710 types of colors of 16 bit channel, which has the color code value that can be recognized by a scanner.), the media can be recognized and the color code value can be generated.

Drawing 28 represents another practical example of the whole composition of computer network system for performing this invention. Like in Drawing 27, it is the same that the procedure regarding whether to provide the internet network service information is performed by a card (16) regarding whether to provide the internet network service information, but the difference is that the server computer of Drawing 27 is distinguished into a server regarding whether to provide the internet network service information (12) and a service server (13).

It is shown that a database (12b) for whether to provide the internet network service information, which is necessary for a procedure about whether to provide the internet network service information, is mounted in the server of whether to provide the internet network service information. However, as necessary, the information regarding whether to provide the internet network service information on the customer managed by each service server (13) is established as a algorithm database of color code value and if it is asked to a user to perform the procedure regarding whether to provide the internet network service information or whether to provide the internet network service information is asked to a person who wants to receive the information in the server regarding whether to provide the internet network service information the result about whether to provide the internet network service information can be replied.

The actual application status of the service system regarding whether to provide the internet network service information is simply described as follows; If a user applies for registration to the server, the server allots the information on whether to provide the native internet network service information to each user. The information regarding whether to provide the internet network service information is encoded by the encoding algorithm of the algorithm database of the required color code value and is produced as the code value. The server indicates the encoded code value in the media regarding whether to provide the internet network service information and issues it.

In the procedure regarding whether to provide the internet network service information so that a user can receive the service provided by the server, a user receives the entered color code value by using the multimedia input device for the code value indicated in the media regarding whether to provide the internet networks service information and transmits the color code value to the server. (Or, a user can transmit the information, which was extracted through decoding the color code value, to the server.)

Accordingly, after the server identifies whether the user is qualified for receiving the information by performing the procedure regarding whether to provide the internet network service information, the server provides a service.

The methods for services regarding whether to provide the internet network service information according to this invention are as follows;

1) The method of providing information to a user through a global card available to all services, by using the card regarding whether to provide the internet network service information.
2) The method of issuing a card regarding whether to provide the internet network service information, which can be used for each service, to a user.

In case of the above (1) method, as a card regarding whether to provide an internet network service information, the whole service servers connected to server regarding whether to provide an internet network service information are accessible. For example, user registered in server regarding whether to provide an internet network service information, can use all kinds of service connected to server regarding whether to provide an internet network service information, such as e-book service or internet phone service, as using his own card regarding whether to provide an internet network service information. Therefore, in the server regarding whether to provide internet network service information, once finished a process regarding whether to provide internet network service information, whole service content which server could provide should be noticed to user, who can select and use one service of them.

In addition, in case of the above (2) method, the information regarding whether to provide an internet network service information indicated on the card regarding whether to provide an internet network service information issued to user, is separately offered in each service, with a card regarding whether to provide an internet network service information, it's accessible to only specific one or several service servers.

In case "A" self-registers before using "internet phone" service and "e-book" service, as providing with an information regarding whether to provide an internet network service information, separate card regarding whether to provide an internet network service information are issued. In this case, each card regarding whether to provide an internet network service information becomes a specific card regarding whether to provide an internet network service information, as decoding the code value of a card regarding whether to provide an internet network service information, when confined to user, connected to the service server at once and provided with the determined service.

Therefore, as to the information regarding whether to provide an internet network service information saved in server regarding whether to provide an internet network service information, the service content (network address or service sever address and kind of service, etc.) which user will use, is saved together, or service server information should be in code value along with an information regarding whether to provide an internet network service information.

Therefore, it's available to register user in the service server which is not a server regarding whether to provide an internet network service information. In this case, service server reports about user through the server regarding whether to provide internet network service information and selected service, the server regarding whether to provide internet network service information issues a card regarding whether to provide internet network service information to user. The process regarding whether to provide an internet network service information is performed by server regarding whether to provide an internet network service information, or if the color code value algorithm database and software are installed in service server, provided from the server regarding whether to provide an internet network service information, it may be possible to perform a process regarding whether to provide an internet network service information directly in service server.

Drawing 30 is a code conversion table used in encoding and decoding color code value algorithm according to this invention, which means a color code value algorithm database code conversion table indicating daily practical case of code conversion table in which the information regarding whether to provide an internet network service information made by various letters (alphabet or special letter, etc.) converted into code value. As the way of encoding, after converting various letters into code:

Color code value assigned to each code value (HTML code value which is a code value notation of hexadecimal)
With (example of indication, C++ color=0x44FAFF, HTML color=#FFFA44
RGB color=255, 250, 68) . . . )

Code value is created into the one which is capable of electric recognition.

In this example, in case those three factors of RGB (Red, Green, Blue) are 16 bit channel indicated by pixel, the value of $2^{16}$ approval 65,536 may have a value embodied in the color of each light. That is, in case of mixing of 65,536 Red color*65,536 Green color*65,536 Blue color, the color tone generates a code value of 281,474,976,710 color, in case that these values are indicated as recursive function (n!) n Factorial, a variable code value of limitless case.

That is, in case of such code value, creating it, it indicates an example using pixel binary of color code value which is able to cognize one letter or number. As to each color code value, various types of value needed to transmit internet network service information such as from number "0~9" to alphabet capital and small letter "A.a~Z.z", "special letter", "words", "sentence", "file", might be assigned as the code value.

In accordance with the transformation table set forth in drawing 30, after making various letters or numbers as a code value, which are included in the information regarding whether to provide an internet network service information, it's available to express as a matrix united with cells corresponding to the color code value, or bar, geometrical figure. Also, as drawing up a color code value algorithm transformation table, in consideration of interval between cells (lines), coding is available, in addition that it's possible to be coding as a type compounding cell and line-typed line each other.

If it's possible to provide with encoding algorithm which is able to code with various physical expression like this, an adaptability could be furnished to expression of more abundant letter (for example, Chinese or Japanese as well as Korean or English alphabet, etc.).

In case of color matrix that is an example of code value, in process of decoding and in data realm made by encoding actual code information, reference realm made by reference cell used as standard color might be included and organized. At this point, reference realm is used to set up standard color that recognizes color expressed in data realm. In according to printer type or quality of printing paper, color might be differently expressed, same as to scanner or camera type. In consideration of this point, reference cell in reference realm offers a standard to discriminate color contained in data realm.

That is, the color described in cell of data realm shall have a relative color difference contrasted with standard color in reference realm. Therefore, although input or output equipment of color code value might be changed, the regular color difference between reference and data realm makes it possible to recognize correctly cell color described in data. As a result, decoding to color code value which is more confidential is possible.

In addition, color matrix can contain parity cell along with data cell. Parity is to check error or correctness of original code data. For example, in accordance with an even or odd number, bit number which has digital data bit value "1" contained in the end of one line/or one row might be described as a cell that has specific color.

The number of cell contained in color matrix might be determined properly in consideration of number of information regarding whether to provide Internet network service information. The structure should be N×M sized-matrix type, but in consideration of the necessity of receiver or of feature of medium describing color code value, it's possible to express as an optional type such as a circle or an oval and to notice on the location of plural number. The cell contained in color matrix color code value is made by HTML (hexadecimal) value of color.

In the concrete, the way to transform information (15a) regarding whether to provide internet network service information into color code value (16a) by encoding-only software (15c) is like the following. The letter more than one or numbers contained in information regarding whether to provide an Internet network service information were transformed by code transformation table of prescribed color code value as same as Drawing 29, various types of value needed to transmit internet network service information such as number "0~9" or alphabet "adz", "special letter", "words", "sentence", "file", are transformed into color code value made by its value or its compounding (available to include letter, number).

At this point, code transformation table of color code value is that determined relations mapping various letters and numbers and signs respectively to prescribe color. For example, there are codes like barcode or PDF-417 as well as an example described in Drawing 29, matrix made by one-dimensional or two-dimensional black-and-white or colored cell or lines comes under this.

A code (16a) is printed as a visual type to personal management card, or is able to be existed inside e-mail message as a type of file data which computer could decipher. As decoding the color code value (16a) by code transformation table, it's possible to obtain initial "information regarding whether to provide internet network service information" described with letter and number, in addition, the color code value itself might be a capture tool.

Drawing 29 is a plan to describe an example of medium (16) regarding whether to provide internet network service information issued to user. Though this case gives an example of card regarding whether to provide internet network service information, with type and size of recording information in the medium such as personal management card, ID card, and passport, the type and size are variously adaptable according to application state, even with information recognized as electric file type, smart card might offer whether to provide internet network service information, by interchanging internet network service information with algorithm color code value.

Encoding method is divided into direct encoding and index encoding. Direct encoding method is to create color code value as encoding directly information regarding whether to provide internet network service information with color code transformation table. Index encoding method is to transfer into the type of as encoding index information (for example, address of database or record number) to refer database (12b) regarding whether to provide internet network service information, with color code transformation table. Encoded color code value might be automatically output by algorithm of program, or might be made by graphic editor or by hand.

Drawing 31 is a plan to describe an example of information regarding whether to provide internet network service information expressed as color code value. Drawing 32 is a plan to describe an example of server address information which is able to be expressed as color code value along with information regarding whether to provide internet network service information. Regarding to information regarding whether to provide internet network service information and server address information of drawing 31 and 32, direct encoding method is applied. If information regarding whether to provide internet network service information and/or index information about server address information are set up, it's possible to create code by encoding index information (index encoding method).

As referring drawing 32, information regarding whether to provide Internet network service information is covering a code regarding whether to provide internet network service information, random code, user's ID, and password, to user who wants to get each information, it's to possible to set up the whole or part among them optionally as information regarding whether to provide internet network service information. In addition, information regarding whether to provide internet network service information is covering category information (for example, security rating code).

Code information regarding whether to provide internet network service information" is a kind of serial number offered to user from server. For example, in case of gate control system in some company, the range of card usage might be determined by differing code system regarding whether to provide internet network service information of pass for visitor and for employee (or staff pass) or the range of serial number.

In case that each gate is fixed to allow some qualified people to pass, for example, in case of limiting to pass for other department except for working department or superior one, or in case of permitting only who obtained regular security rating to pass because each gate is fixed with security rating, in accordance with the range of user's authority, as setting up the range of serial number of code regarding whether to provide internet network service information or category information, as indicating encoded code to user's card, and then it's issued. "Random code" is information created randomly. As user inserts a regular key value (for example, his/her password), it's possible to be created according to the key value.

In case of ordinary payment by credit card, only have to insert card number after order, the deal is done, but there's riskiness of card stealing in case of knowing just card number even though the card does not belong to himself. By service regarding whether to provide internet network service information with random code, e-commerce server is getting and saving user's key value (password), as encoding random code created according to the key value, a card regarding whether to provide internet network service information with color code value is issued to user.

In case that user intends to order and settle accounts, as offering whether to provide internet network service information of user who wants to get by primary, by receiving "key value" (password) as well as card number input, in addition, it's possible to offer whether to provide internet network service information to user who wants to get double, as confirming whether the random code corresponds to "key value" by getting random code input extracted from color code value of card of whether to provide internet network service information.

Drawing 32 shows the additional server address information (about whether to provide internet network service information and service server address) along with information regarding whether to provide internet network service information. This additional information can be added optionally by whole or one.

"Server address regarding whether to provide internet network service information" means network address of server in which database regarding whether to provide internet network service information, in which user's information regarding whether to provide internet network service information is saved.

Basically it's normal to prepare database regarding whether to provide internet network service information in server (12) which offers service regarding whether to provide internet network service information (in this case, server computer (12) becomes a server regarding whether to provide internet network service information, there's no need to add server address regarding whether to provide internet network service information), but it's also possible to possess separate server which saves database regarding whether to provide internet network service information, for information regarding whether to provide internet network service information of user who wants to get information from specific group.

For example, for employee in specific corporation, or for subscriber of specific service company, with this service usage registered, it's possible to fulfill server regarding whether to provide internet network service information which separately manages information regarding whether to provide internet network service information of user who wants to get the registered information from the corporation or service company. In this case, only when server address regarding whether to provide internet network service information is included along with information regarding whether to provide internet network service information, it's possible to get on-line service regarding whether to provide internet network service information. In other words, it means that database (12a) regarding whether to provide internet network service information described in Drawing 27 might be concentrated on one server, but scattered through several servers.

"Service server address" means network address of server which offers service by card regarding whether to provide internet network service information. Basically it's normal to offer directly service regarding whether to provide internet network service information in server (12) (in this case, server computer (12) becomes service server, there's no need to add service server), the card regarding whether to provide internet network service information which could use service only offered from specific service server.

For example, in case of card regarding whether to provide internet network service information for "internet phone" service, user requests to issue a card regarding whether to provide internet network service information for the service, by server regarding whether to provide internet network service information, server regarding whether to provide internet network service information is offered as color code value with information regarding whether to provide internet network service information of user, along with information such as service server address connected to the service. The user can use directly "internet phone" service after finishing process regarding whether to provide internet network service information as connecting server regarding whether to provide internet network service information with the card described with color code value.

On the other hand, even though it's not noticed in drawing, after user complete the process regarding whether to provide internet network service information, "service server" designating specific network service can be added. In this case, the card regarding whether to provide internet network service information is directly connected to specific service. This service information is one to define service which could be offered from service server.

In case of using internet service, there are services defined by protocol noticed in URL such as web service, telnet service, e-mail service, Gopher service, FTP (File Transfer Protocol). In case of not including service information after decoding, service basically set up in program is offered, or user may choose service separately. On the other hand, service information includes service defined by other general communication instrument, such as phone or fax service, along with things for network service through internet.

Drawing 33 is a plan to describe an example of content which is saved in database (12a) of user, in which personal information such as homepage, e-mail address, telephone number, and fax number, as well as user's name, address, zip code, and nationality, is saved. In addition, index information to refer personal information. Drawing 34 is a plan to describe an example of content which is saved in database (12b) regarding whether to provide internet network service information of server (12).

For user who wants to get each information, information regarding whether to provide internet network service information and/or server address information is saved, and index information can be added to refer each information. For user who wants to get each information, only information regarding whether to provide Internet network service information could be offered, in addition, for user who wants to get same information, by each service, information regarding whether to provide internet network service information could be offered.

Drawing 35 is a flow plan to describe offering process of card regarding whether to provide internet network service information to user. First, user who wants to get service regarding whether to provide internet network service information shall apply to information use registration (17) by connecting server (12). At this time, applicant shall input his personal information (for example, applicant's name, e-mail address, postal address, zip code, nationality, homepage address, telephone number, fax number, etc.). Server (12) saves these personal information in applicant's database.

Server (12) offers to each applicant information regarding whether to provide internet network service information and server address information (72), and saves them in database regarding whether to provide internet network service information. In case saving information regarding whether to provide internet network service information other server of whether to provide internet network service information except server (12), the server (12) saves address of server of whether to provide internet network service information, in addition to transfer the applicant's information regarding whether to provide internet network service information to the relevant server of whether to provide internet network service information. And, in case that service server offering service by whether to provide internet network service information is set up separately from server (12), service server's address is also saved in server (12).

Information regarding whether to provide internet network service information offered from server (12) should be encoded by encoding algorithm (73). On the other hand, server address information should not be encoded because it's needed to use directly that information from user's computer. As a method of encoding, it's possible to use the method to change quantity and kind of information by using hash algorithm, or by changing the order of letter of substituting with other letter of original information regarding whether to provide internet network service information with prescribed algorithm.

Information regarding whether to provide internet network service information (if it's encoded, encoded information regarding whether to provide internet network service information) and server address information is encoded (74) to color code value by prescribed color code value transformation (table Drawing 4.) Encoding process for information regarding whether to provide internet network service information might be performed before encoding information, but it's possible to perform encoding process after encoding information regarding whether to provide internet network service information. This encoding method may be substituted for other thing such as changing order of type expressed with color code value, letter, pattern, and color.

Server (12) issues a medium regarding whether to provide internet network service information as indicating color code value to applicant (75). Color code value might be issued as attached or as printed in a material object such as a card, and in a state computer can read (for example, to be indicated directly on monitor screen, or as a HTML color code value file type which can be read by program).

Drawing 36 is a flow plan to describe process which is offered service and whether to provide internet network service information of applicant, by using card, according to this invention. Server computer (12) offers encoding and decoding algorithm by using color code value, as controlling over service regarding whether to provide internet network service information, applicant's computer (15) has index information which is key value to get access to database saved with actual information such as code of whether to provide internet network service information of various network service or server address, after passing through process regarding whether to provide internet network service information.

On the process of decoding, the process which finds out type, color, pattern, and letter which are included in color code value is needed, except this; the process which corrects distortion is needed. In here, it is possible to distinguish color code value with more than one method among RGB (Red, Green, and Blue) model, HSV (Hue angle, Saturation, Value) model, CMY (Cyan, Magenta, and Yellow) model, and HLS (Hue angle, Lightness, Saturation) model. Also it's possible to detect type and pattern as using boundary line detection and thinning algorithm, As a result of decoding, it decides whether server address regarding whether to provide internet network service information is included in decoded information. (82). As the foregoing, information encoded with color code value covers address information of server regarding whether to provide internet network service information provided for process regarding whether to provide internet network service information separately with basic server, as well as information regarding whether to provide internet network service information.

If server address regarding whether to provide internet network service information is detected, get access to the server regarding whether to provide internet network service information designated to the information (83), if not, get access to the server regarding whether to provide basic internet network service information (84). In general, the server regarding whether to provide basic internet network service information shall be a basic server.

When color code value is created, in case of encoding information regarding whether to provide internet network service information, the server regarding whether to provide internet network service information decodes information regarding whether to provide encoded internet network service information and restores to original information (85), and then the server regarding whether to provide internet network service information decides whether to provide internet network service information.(86) If information regarding whether to provide internet network service information registered in server regarding whether to provide internet network service information does not coincide with the information regarding whether to provide internet network service information which applicant inserted, error is indicated.(90)

Drawing 37 is a plan to describe system genealogy of which service server is united with server regarding whether to provide internet network service information, drawing 38 and 39 are operating a plan describing system genealogy in which server regarding whether to provide internet network service information and service server are differently constituted, in order of number described on drawing.

As referring drawing 37, if user registers applicant along with information such as his ID and password by service server (92) regarding whether to provide internet network service information, the service server (92) regarding whether to provide internet network service information assigns information regarding whether to provide internet network service information to the applicant, as encoding this with color code value by encoding-only software, and offers card (96) regarding whether to provide internet network service information indicated color code value to applicant.

At this time, as installing decoding-only software in server on the applicant's computer (95), applicant-based decoding method is applicable. If decoding-only software is not installed, server-based decoding method is applied.

In here, applicant-based decoding method means that decoding process is processed in applicant's computer, in condition that applicant's computer (15) installed decoding program downloading from server computer (12), in accordance with the content of information regarding whether to provide internet network service information, and it's divided into index decoding method and direct decoding one. Server-based decoding method means that, in condition that decoding program is not installed in applicant's computer (15), a method performing decoding process in server computer (12).

If applicant's computer (95) is inserted color code value indicated in card (96) regarding whether to provide internet network service information through multimedia input screen equipment that is saved in data capturing device such as memory or disk drive. Color code value is decoded by decoding software. Decoded information is transferred to server (92), server (92) performs process regarding whether to provide internet network service information according to the information, if whether to provide internet network service information of applicant is successfully completed, and it offers service to applicant.

When drawing 38 is referred, if an applicant applies for applicant registration along with his/her own ID, password, etc. to the server regarding whether to provide the internet network service information (102), the server assigns the information on whether to provide the internet network service information and service server address data to the applicant, and encodes these data into the color code values by the software for encoding, and provides the card (106) regarding whether to provide an internet network service information, where color code values are indicated, to the user.

At this time, if the software for decoding in the server (102) is installed in the applicant's computer (105), the decoding method based on an applicant can be applied. If the software for decoding is not installed in the applicant's computer, the decoding method based on a server is applied.

When the color code value, which was indicated in the card (106) regarding whether to provide the internet network service information are entered in the applicant's computer through a multimedia input imaging equipment, the color code value is saved in the data saving device such as memory or disk drive. The color code value is decoded by the software for decoding. The decoded data are transmitted to the server (12), and the server performs a procedure regarding whether to provide the internet network service information according to the data, and connects to the service server according to the service server address to provide the relevant service to a user.

When drawing 39 is compared with drawing 38, in drawing 39, except that if in the server, whether or not to provide the internet network service information is confirmed, the service server is connected to a user's computer and directly provides a service, the remaining processes are the same to those of drawing 38.

The example of using a card regarding whether to provide the internet network service information used in this invention and the effect of the card will be described below;

First, as data, when the random numbers or serial numbers are encoded into the color code values, in a procedure regarding whether to provide the internet network service information, after the ID and password of an applicant are entered, additionally the color code value data are required, so that the security level can be more heightened. Since only when the data regarding whether to provide the internet network service information extracted from the color code value are available, the service can be used, the security can be improved.

In particular, in case of E-commerce trade, in the past time, if a user knows only the number of a credit card and valid period, the dealings are made, so there often occur the cases that the credit card number and valid period are disclosed to others and stolen for use. However, if a color code value according to this invention is provided to a credit card, only the person who holds the credit card can make a deal, and therefore, the color code value indicated on the credit card performs a role of magnetic tape instead on the internet.

That is to say, the color code value for the information on providing the internet network service information, which was converted to the encoding and decoding algorithm of the color code value, is indicated in the media regarding whether to provide the internet network service information. That is, the information regarding whether to provide the internet network service information allotted to an applicant is encoded and converted into the color code value, which is represented physically, and the color code value is indicated in the media.

In the procedure regarding whether to provide the internet network service information for E-commerce trade, along with the user's ID and password, the color code value, which was entered through the multimedia input imaging equipment such as a camera or scanner, can be used for deciding whether the Internet network service information is provided to user.

Also, in such media, the user's financial information can be indicated, too. That is, the user's financial information is encoded by the encoding algorithm and converted into the color code value. Then, this color code value is indicated in the media, or the financial information is additionally indicated in the media by using a magnetic tape.

If the magnetic tape area indicated in a credit card can be said to be used when a user makes a dealing through the terminal of the financial institute, it can be said that the color code value, which is added according to this invention, is used for the E-commerce trade in the internet by using a multimedia input imaging equipment. Of course, if the terminal for trade of the financial institute is equipped with a function of interpreting the entered color code value, card data, which are indicated by a magnetic tape, can be indicated by color code values according to this invention, and then, one credit card becomes a mean that can be used for both off-line financial dealing and online E-commerce trade.

Meanwhile, this color code value can be applied to an employee's identification card. In the ID tag card, which is used as an employee's card, a RF (Radio Frequency) tag is built in, and this RF tag performs a function of tracing the location of a user by printing out the code data by using the radio frequency, but the cost for producing the RF tag is expensive. On the contrary, this invention' technology is an economic information management system, which can provide a function of complementing the information that checks whether the data established in the server are identical according to whether to provide the internet network service information, while the encoding and decoding color code value is used for an employee's card.

This invention enables the code, which can be read by a computer, to be realized in the record media that can be read by a computer. The record media that can be read by a computer includes all kinds of record devices where the data, which can be read by a computer system, are saved. The examples of the record media are ROM, RAM, COD-ROM, magnetic tape, hard disk, floppy disk, flash memory, optical data saving device, etc., and also includes what is materialized in the form of carrier wave (for example, transmission via the internet).

The service regarding whether to provide the internet network service information according to this invention can be applied to all procedures regarding whether to provide the internet network service information for checking the right to use of the user and the payment system, and for checking whether the person is qualified for receiving the data in the controlling system for entrance or the site that requires charges.

Drawing 39 represents the concept that in the conventional compressed data file, the color code value is compressed, so that the conventional file is converted into the (decompressed) restored data file. Through these files, the data of software files, which are composed of binary digits, which can be electronically recognized in the data file management area or information process area, are added and compressed, so that the quantity of information is reduced. The file forms are as follows; as for the motion picture file, there are FLI, FLC, AVI, MPEG, ASF, WMV, RM, MOV, and as for the music file, there are mid, wav, mp3, mp4, and as for the image file, there are BMP, JPG, TIF, GIF, and ARJ, and as for the text file, there are TXT, RTF, DOC, HWP. The basic structure of these files is composed of the binary digit file, which is recognized as a mechanic language, and also is composed of ASCII files. The method of compressing these data are as follows; 1) RLE (Run Length Encoding) method. 2) Huffman Coding method. 3) LZW (Lempel Zip Welch) method. The RLE (Run Length Encoding) method is to recognize the ASCII code, which appears repeatedly, and reduce and compress it. That is, when the ASCII code is 'AAAAAABBCDDEEEEEF', this method reduces and compresses it into 'A6B2C1D2E5F1' value. However, this method is highly effective for the data such as an image file, whose repeated appearing frequency is high, and in a document file, if the data is compressed, its data quantity increases, so this method is mainly used for the image graphic file.

As the method of using these data compression effectively, the Huffman coding method is used.

The Huffman coding method is described below; Read the file data to be compressed, and obtain the appearing frequency of each character. Among them, make the binary digit tree structure by grouping the character, whose frequency is the lowest, and obtain the value that represents each character. Memorize the character value as binary files, and save them.

As described above, as you can know in the barcode area and internet service area, the value of color, which is recognized as 16 bit channel electronically and mechanically, has a factor value; the combination of 65,536 red colors and 65,536 green colors realizes 281,474,976,710 colors. In case of this combination, there is a merit that the parameter variable of 281,474,976,710 factorial cases is made, so the limitless parameter variable factor values can be made to correspond, Until now, the compression indicates a process where size of space necessary for saving is reduced, that is, the method of representing data by using the shorter length of code, and the decompression indicates a process where the data are restored to the original status in order to use data.

The method of compressions includes lossy compression and loss-less compression. The data such as a program and data should be processed by loss-less compression, and the files such as images and voices can be processed by lossy compression. The file extension, which are used for the application software, are *.alz, *.ace, *.arc, *.alJ. *.b64, *.bh, *.bhx, *.bz2, *.cab, *.ear, *.enc, *.gz, *.ha, *.hqx, *.ice, *.jar, *.lha, *.lzh, *.mim, * pak, *.rar, *.tar, *.tgz, *.uue, *.war, *.xxe, *.z, *.zip, *.zoo, *.oo1. For these files the compression, whose method is that the parameter variable of color values corresponds to an algorithm, is used. Through this method of compression, since these files are composed of binary digit files, the ASCII file form and binary digit file form can be recognized by the variable of color factor value (Html, C++) to be made to correspond according to this invention.

Therefore, the compression method by using the above characteristics is as follows.

As shown in drawing 40,

First: Each conventional file data recognize and distinguish data files, which are arranged by analyzing ASCII characters, or arranged in the form of binary digit file.

Second: Calculate the recognized parameter variable (the parameter variable in case of corresponding to color codes)

Third: The value is recorded in the unit variable that recognizes the color of corresponding parameter variable values (Html, C++).

Fourth: For the data, which were recorded in the ASCII file or binary digit file of Html or C++ value, the file extension name is decided as *.col or *.ooo and saved.

Fifth: The saved file is arranged in the order of color factor value in the graphic image pixel unit and saved as the image and displayed. (The graphic image file with the resolution of 1024*1024*1024 memorizes 1,073,741,824 types of parameter variable values and saves them.)

Sixth: The saved color image data file is transmitted in the status of graphic images on the wired and wireless internet network.

Seventh: The received color image data file is interpreted by the encoding and decoding algorithm of color code values, which were built in the hardware of a user's main computer, and decompressed (restored) into the compressed file that was used in the previous time.

Eighth: The restored image data file is recognized in the program such as image file, motion picture file, and music file, which are internationally standardized and used at present, and is used.

EFFECT OF INVENTION

Through the above process, in the basic data of algorithm data of drawing 40, 8 bit channel ASCII file information and binary digit file information records of information files, which have all file extensions (*.txt, *.hwp, *.bmp, *jpg, *.tif, *.gif, *.adj, *.zip, *.avi, *.mpeg, *.rm, *.flc, *.fli, *.mov, *.asf, *.wmv, *.mid, *.wav, *.mp3, *.mp4), are made to correspond to HTML color values of hexadecimal notation, which are memorized as 16 bit channel of color code values, and these arranged files are recorded as *.col. Its purpose is to compress barcodes and data by using decoding algorithms and provide an internet service method.

What is claimed is:

1. A method for exchanging electronic information data, using a color barcode having a plurality of color values made of a combination of n-bit of red, green, and blue color parameters, in which the color values correspond to a plurality of predefined legend, the method comprising:
    (a) selecting the electronic information data from a first computer;
    (b) encoding the selected electronic information data into a barcode data containing a plurality of cyan, magenta, yellow, black (CMYK) values corresponding to the selected electronic information data;
    (c) transmitting the barcode data to a second computer;
    (d) printing the color barcode with a red, green, blue (RGB) only barcode printer, wherein the color barcode corresponds to the barcode data;
    (e) reading the color barcode with a barcode scanner;
    (f) detecting a plurality of optical wavelengths from the color barcode from red, green, blue (RGB) photo diodes collecting light signals from the color barcode;

(g) confirming a start margin, a stop margin, a start character, a stop character, a data character, and a check character, by checking the detected photo wavelengths;

(h) measuring a spectral diffraction intensity of light, which is emitted and reflected from a light emitter of the scanner as spectral diffraction intensity data by a 1,024 channel array detector;

(i) arranging the measured 1,024 spectral diffraction intensity data to correspond to a plurality of optical wavelength values ranging from 380 nm to 780 nm;

(j) calibrating a spectral diffusion intensity value of the array detector according to each of the plurality of values corresponding to the plurality of optical wavelengths;

(k) organizing the calibrated spectral diffusion intensity value as a graph;

(l) obtaining color values kX, kY, and kZ, and color coordinates x, and y;

(m) setting up a corresponding variable value in accordance with a plurality of coordinates values having coordinates of CIE system of color specification;

(n) determining a criticality value;

(o) decoding the color barcode into a preferred data format which is secured by comparing criticality value and a rate of error; and (p) transmitting and printing out the electronic information data.

* * * * *